US012622023B2

(12) United States Patent
Kang et al.

(10) Patent No.: US 12,622,023 B2
(45) Date of Patent: May 5, 2026

(54) SEMICONDUCTOR DEVICE

(71) Applicant: SAMSUNG ELECTRONICS CO., LTD., Suwon-si (KR)

(72) Inventors: Seung Mo Kang, Suwon-si (KR); Taegon Kim, Suwon-si (KR); Jaemun Kim, Suwon-si (KR); Jaehoon Oh, Suwon-si (KR); Sunhye Lee, Suwon-si (KR); Sihyung Lee, Suwon-si (KR); Juri Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 483 days.

(21) Appl. No.: 18/182,435

(22) Filed: Mar. 13, 2023

(65) Prior Publication Data

US 2023/0411451 A1     Dec. 21, 2023

(30) Foreign Application Priority Data

Jun. 16, 2022     (KR) ........................ 10-2022-0073692

(51) Int. Cl.
H10D 62/10 (2025.01)
H01L 21/02 (2006.01)
(Continued)

(52) U.S. Cl.
CPC ..... H10D 62/116 (2025.01); H01L 21/02164 (2013.01); H01L 21/76224 (2013.01); H01L 21/76829 (2013.01); H10D 30/6735 (2025.01)

(58) Field of Classification Search
CPC ............. H10D 62/116; H10D 30/6735; H10D 30/6757; H10D 64/518; H10D 62/121;
(Continued)

(56) References Cited

U.S. PATENT DOCUMENTS 6,500,728 B1 * 12/2002 Wang ................ H01L 21/76232
257/E21.549
7,402,483 B2 7/2008 Yun et al.
(Continued)

FOREIGN PATENT DOCUMENTS

| KR | 10-0257764 | 6/2000 |
|----|------------|--------|
| KR | 10-2021-0047408 A | 4/2021 |
| KR | 10-2022-0072119 A | 6/2022 |

*Primary Examiner* — Marlon T Fletcher
*Assistant Examiner* — Da Wei Lee
(74) *Attorney, Agent, or Firm* — Morgan, Lewis & Bockius LLP

(57) ABSTRACT

A semiconductor device may include a first active pattern and a second active pattern on a substrate, a device isolation layer in a trench between the first active pattern and the second active pattern, a first channel pattern and a second channel pattern provided on the first active pattern and the second active pattern, respectively, each of the first channel pattern and the second channel pattern including a plurality of stacked semiconductor patterns, and a gate electrode on the first channel pattern and the second channel pattern. The device isolation layer may include a first portion and a second portion which are vertically overlapped with the gate electrode. The first portion may be provided on the second portion. A silicon concentration of the first portion may be higher than a silicon concentration of the second portion.

20 Claims, 28 Drawing Sheets

(51) Int. Cl.

*H01L 21/762*       (2006.01)
    *H01L 21/768*       (2006.01)
    *H10D 30/67*       (2025.01)

(58) Field of Classification Search

CPC .. H10D 84/0151; H10D 84/038; H10D 84/85;
           H01L 21/02164; H01L 21/76224; H01L
                                     21/76829
    See application file for complete search history.

(56)                      References Cited

U.S. PATENT DOCUMENTS

| | | | |
|---|---|---|---|
| 10,847,611 B2 | 11/2020 | Choi et al. | |
| 11,075,123 B2 | 7/2021 | Kao et al. | |
| 11,282,921 B2 | 3/2022 | Ahn et al. | |
| 12,211,847 B2 | 1/2025 | Shin et al. | |
| 2009/0242966 A1* | 10/2009 | Son | H10D 64/62 |
| | | | 257/324 |
| 2012/0139033 A1* | 6/2012 | Yamasaki | H10B 10/12 |
| | | | 257/327 |
| 2021/0118991 A1* | 4/2021 | Ahn | H10D 62/151 |
| 2022/0068715 A1* | 3/2022 | Waite | H10D 84/0158 |

* cited by examiner

SEMICONDUCTOR DEVICE

CROSS-REFERENCE TO RELATED APPLICATIONS

This U.S. non-provisional patent application claims priority under 35 U.S.C. § 119 to Korean Patent Application No. 10-2022-0073692, filed on Jun. 16, 2022, in the Korean Intellectual Property Office, the entire contents of which are hereby incorporated by reference.

TECHNICAL FIELD

The present disclosure relates to a semiconductor device, and in particular, to a semiconductor device including a field effect transistor.

DISCUSSION OF RELATED ART

A semiconductor device includes an integrated circuit composed of metal-oxide-semiconductor field-effect transistors (MOS-FETs). MOS-FETs have been scaled down to meet an increasing demand for semiconductor devices with a small pattern size and a reduced design rule. The scaledown of MOS-FETs can lead to deterioration in operational properties of these semiconductor devices. A variety of studies are being conducted to overcome technical limitations associated with the scale-down of these semiconductor devices, and to realize semiconductor devices with higher performance.

SUMMARY

Embodiments of the present inventive concept provide a semiconductor device with improved reliability and electric characteristics.

One or more embodiments of the inventive concept provide a three-dimensional semiconductor device that can be fabricated with improved process efficiency.

According to an embodiment of the inventive concept, a semiconductor device may include a first active pattern and a second active pattern on a substrate, a device isolation layer in a trench between the first active pattern and the second active pattern, a first channel pattern and a second channel pattern provided on the first active pattern and the second active pattern, respectively, each of the first channel pattern and the second channel pattern including a plurality of stacked semiconductor patterns, and a gate electrode on the first channel pattern and the second channel pattern. The device isolation layer may include a first portion and a second portion which are vertically overlapped with the gate electrode. The first portion may be provided on the second portion. A silicon concentration of the first portion may be higher than a silicon concentration of the second portion.

According to an embodiment of the inventive concept, a semiconductor device may include a first active pattern and a second active pattern on a substrate, a device isolation layer in a trench between the first active pattern and the second active pattern, a first channel pattern and a second channel pattern provided on the first and second active patterns, respectively, each of the first channel pattern and the second channel pattern including a plurality of stacked semiconductor patterns, and a gate electrode on the first channel pattern and the second channel pattern. The device isolation layer, which is vertically overlapped with the gate electrode, may include a first portion having a silicon concentration in a range of about 41 at % to about 45 at %.

A level difference between a top surface of each of the first active pattern and the second active pattern and a top surface of the first portion may be larger than 0 Å and may be smaller than or equal to about 200 Å.

According to an embodiment of the inventive concept, a semiconductor device may include a substrate including an active region, a device isolation layer between an adjacent pair of the active patterns, wherein the device isolation layer comprising a first portion and a second portion, and the first portion is on the second portion, such that the first and second portions overlap each other, a channel pattern and a source/drain pattern on the active pattern, the channel pattern comprising a plurality of semiconductor patterns, which are vertically stacked to be spaced apart from each other, a gate electrode on the semiconductor patterns, the gate electrode including a portion between an adjacent pair of the semiconductor patterns, a first gate insulating layer between the adjacent pair of the semiconductor patterns and the portion of the gate electrode, a second gate insulating layer covering the active pattern and a top surface of the device isolation layer, a gate capping pattern on a top surface of the gate electrode, an interlayer insulating layer on the gate capping pattern, a gate contact provided through the interlayer insulating layer and the gate capping pattern and electrically connected to the gate electrode, a first metal layer on the interlayer insulating layer, the first metal layer comprising first interconnection lines, which are electrically connected to the gate contact and a power line, and a second metal layer on the first metal layer. The second metal layer may include second interconnection lines electrically connected to the first metal layer. A silicon concentration of the first portion of the device isolation layer is higher than a silicon concentration of the second portion.

DETAILED DESCRIPTION

Figure 1:
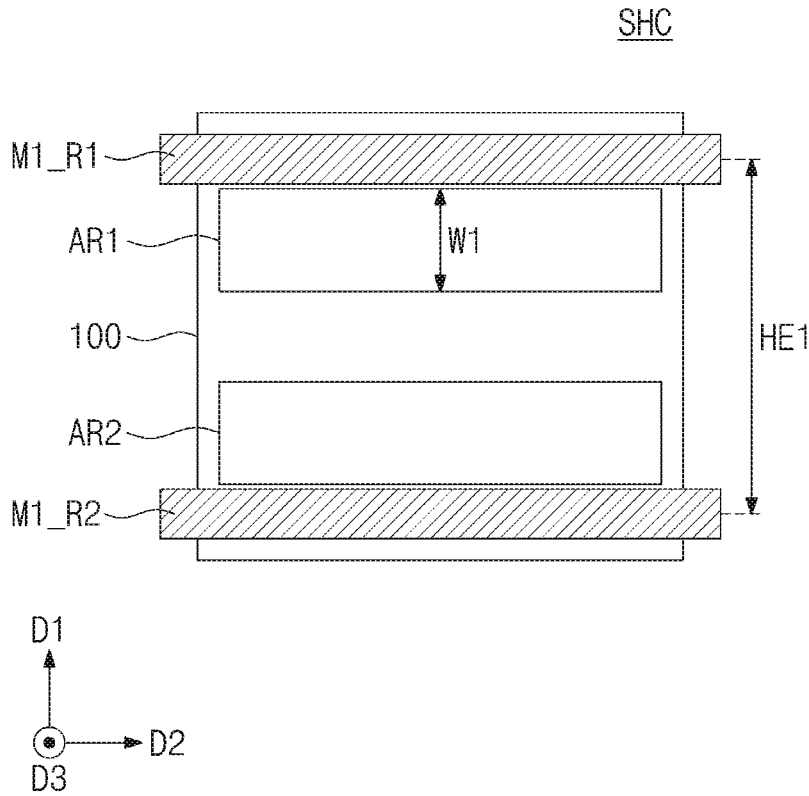
FIGS. 1 to 3 are conceptual diagrams illustrating logic cells of a semiconductor device, according to an embodiment of the present inventive concept.
Figure 2:
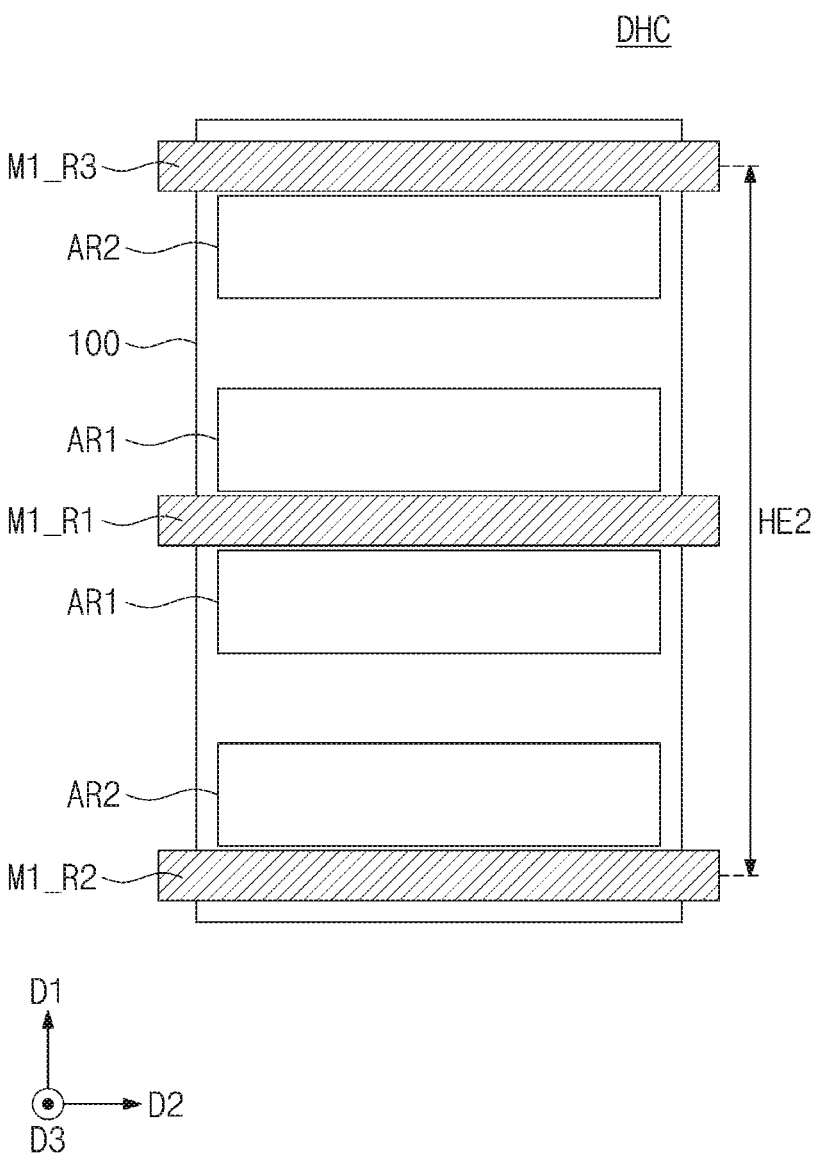
Figure 3:
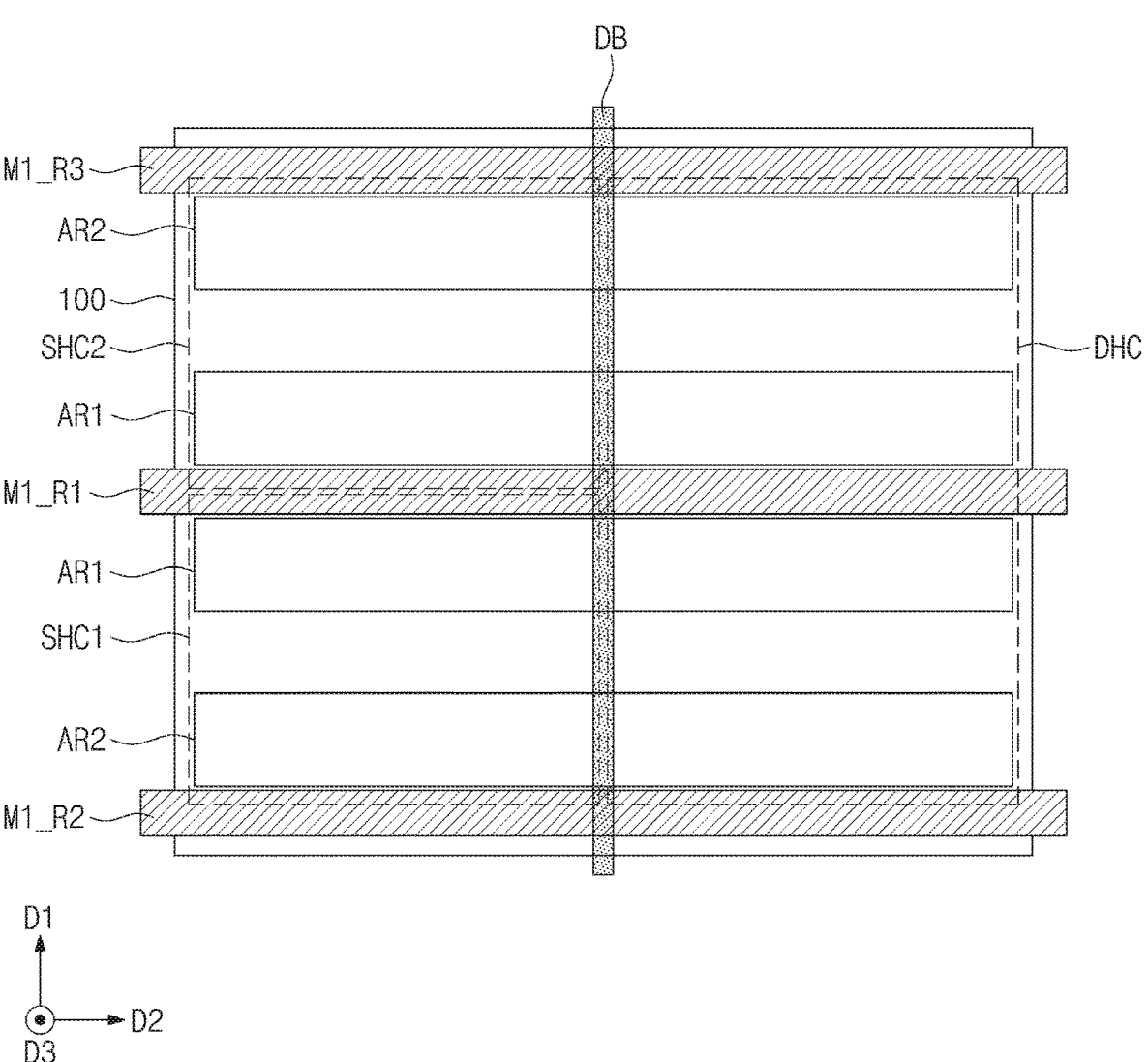

FIGS. 1 to 3 are conceptual diagrams illustrating logic cells of a semiconductor device according to various embodiments of the inventive concept.

Referring to FIG. 1, a single height cell SHC may be provided. In detail, a first power line M1_R1 and a second power line M1_R2 may be provided on a substrate 100. The first power line M1_R1 may be a conduction path, to which a source voltage VSS (e.g., a ground voltage) is provided.

The second power line M1_R2 may be a conduction path, to which a drain voltage (VDD) (e.g., a power voltage) is provided.

In various embodiments, the single height cell SHC may be located between the first power line M1_R1 and the second power line M1_R2. The single height cell SHC may include one first active region AR1 and one second active region AR2. One of the first active region AR1 or second active region AR2 may be a PMOSFET region, and the other may be an NMOSFET region. In other words, the single height cell SHC may have a CMOS structure provided between the first and second power lines M1_R1 and M1_R2.

Each of the first and second active regions AR1 and AR2 may have a first width W1 in a first direction D1. A length of the single height cell SHC in the first direction D1 may be described as a first height HE1. The first height HE1 may be substantially equal to a distance (e.g., a pitch) between the first and second power lines M1_R1 and M1_R2.

The single height cell SHC may constitute a single logic cell. In the present specification, the logic cell may mean a logic device (e.g., AND, OR, XOR, XNOR, inverter, and so forth), which is configured to execute a specific function. In other words, the logic cell may include transistors constituting the logic device and interconnection lines connecting transistors to each other.

Referring to FIG. 2, a double height cell DHC may be provided. In detail, a first power line M1_R1, a second power line M1_R2, and a third power line M1_R3 may be provided on the substrate 100. The first power line M1_R1 may be disposed between the second power line M1_R2 and the third power line M1_R3. The third power line M1_R3 may be a conduction path, to which the source voltage (VSS) is provided.

The double height cell DHC may be located between the second power line M1_R2 and the third power line M1_R3. The double height cell DHC may include a pair of first active regions AR1 and a pair of second active regions AR2.

One of the second active regions AR2 may be adjacent to the second power line M1_R2. The other of the second active regions AR2 may be adjacent to the third power line M1_R3. The pair of the first active regions AR1 may be adjacent to the first power line M1_R1. When viewed in a plan view, the first power line M1_R1 may be disposed between the pair of the first active regions AR1.

A length of the double height cell DHC in the first direction D1 may be described as a second height HE2. The second height HE2 may be about two times the first height HE1 of FIG. 1. The pair of the first active regions AR1 of the double height cell DHC may be combined to serve as a single active region.

In an embodiment, the double height cell DHC shown in FIG. 2 may be described as a multi-height cell. A multi-height cell may include a triple height cell whose cell height is about three times that of the single height cell SHC.

Referring to FIG. 3, a first single height cell SHC1, a second single height cell SHC2, and a double height cell DHC may be two-dimensionally arranged on the substrate 100. The first single height cell SHC1 may be disposed between the first and second power lines M1_R1 and M1_R2. The second single height cell SHC2 may be disposed between the first and third power lines M1_R1 and M1_R3. The second single height cell SHC2 may be adjacent to the first single height cell SHC1 in the first direction D1.

The double height cell DHC may be disposed between the second and third power lines M1_R2 and M1_R3. The double height cell DHC may be adjacent to the first and second single height cells SHC1 and SHC2 in a second direction D2.

A division structure DB may be provided between the first single height cell SHC1 and the double height cell DHC and between the second single height cell SHC2 and the double height cell DHC. The active region of the double height cell DHC may be electrically separated from the active region of each of the first and second single height cells SHC1 and SHC2 by the division structure DB.

Figure 4:
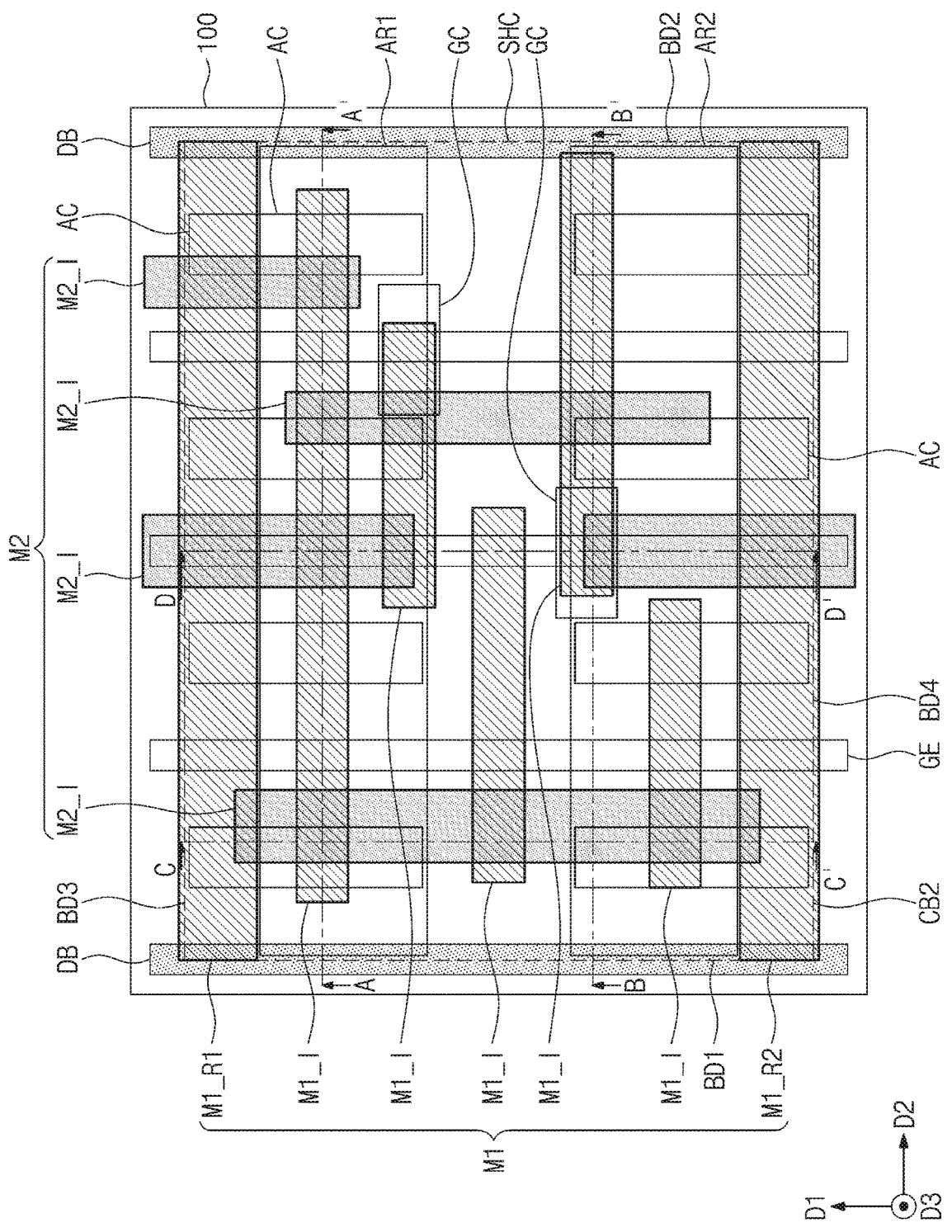
FIG. 4 is a plan view illustrating a semiconductor device, according to an embodiment of the present inventive concept.
Figure 5A:
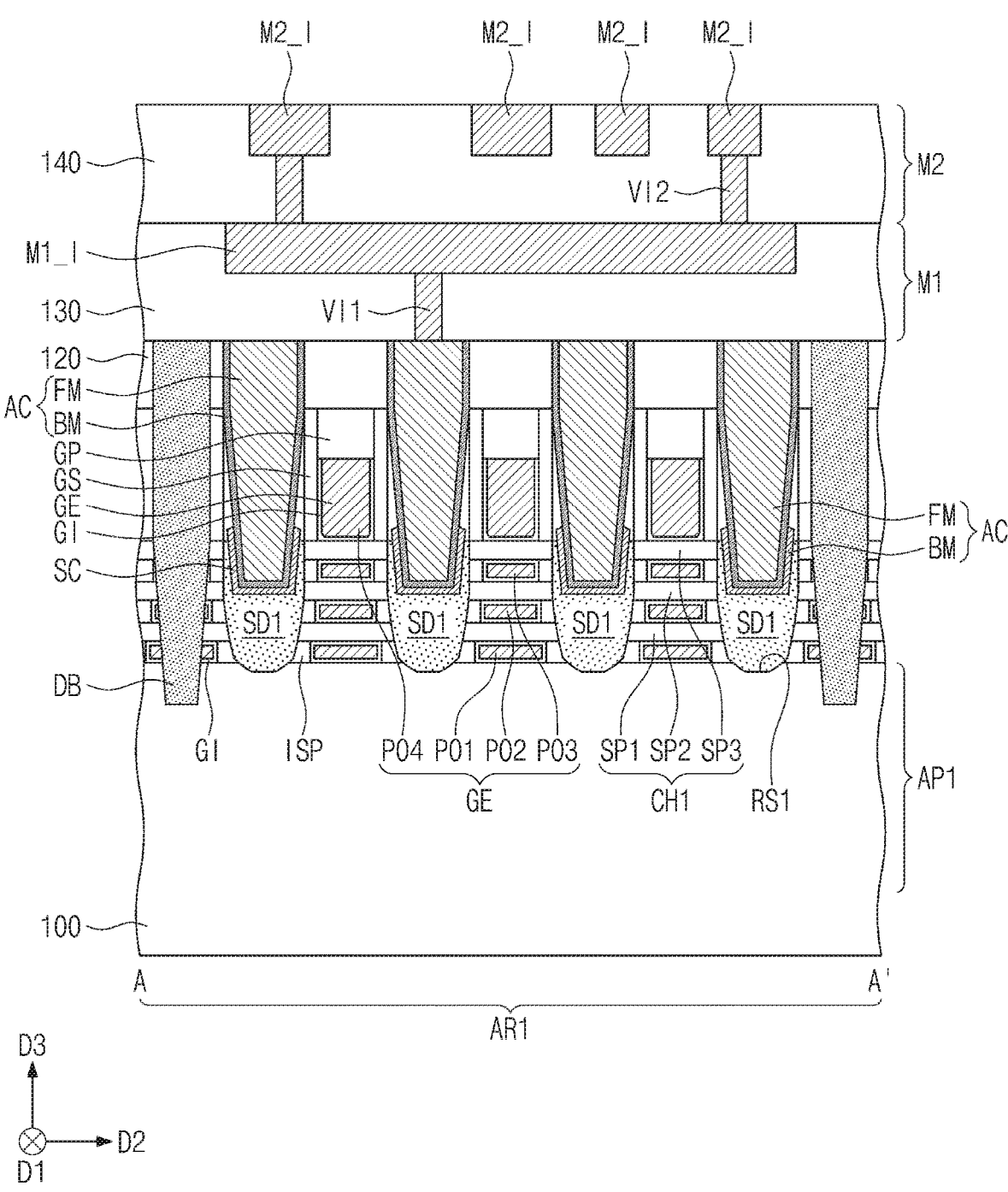
FIGS. 5A to 5D are sectional views taken along lines A-A', B-B', C-C', and D-D', respectively, of FIG. 4, according to an embodiment of the present inventive concept.
Figure 5B:
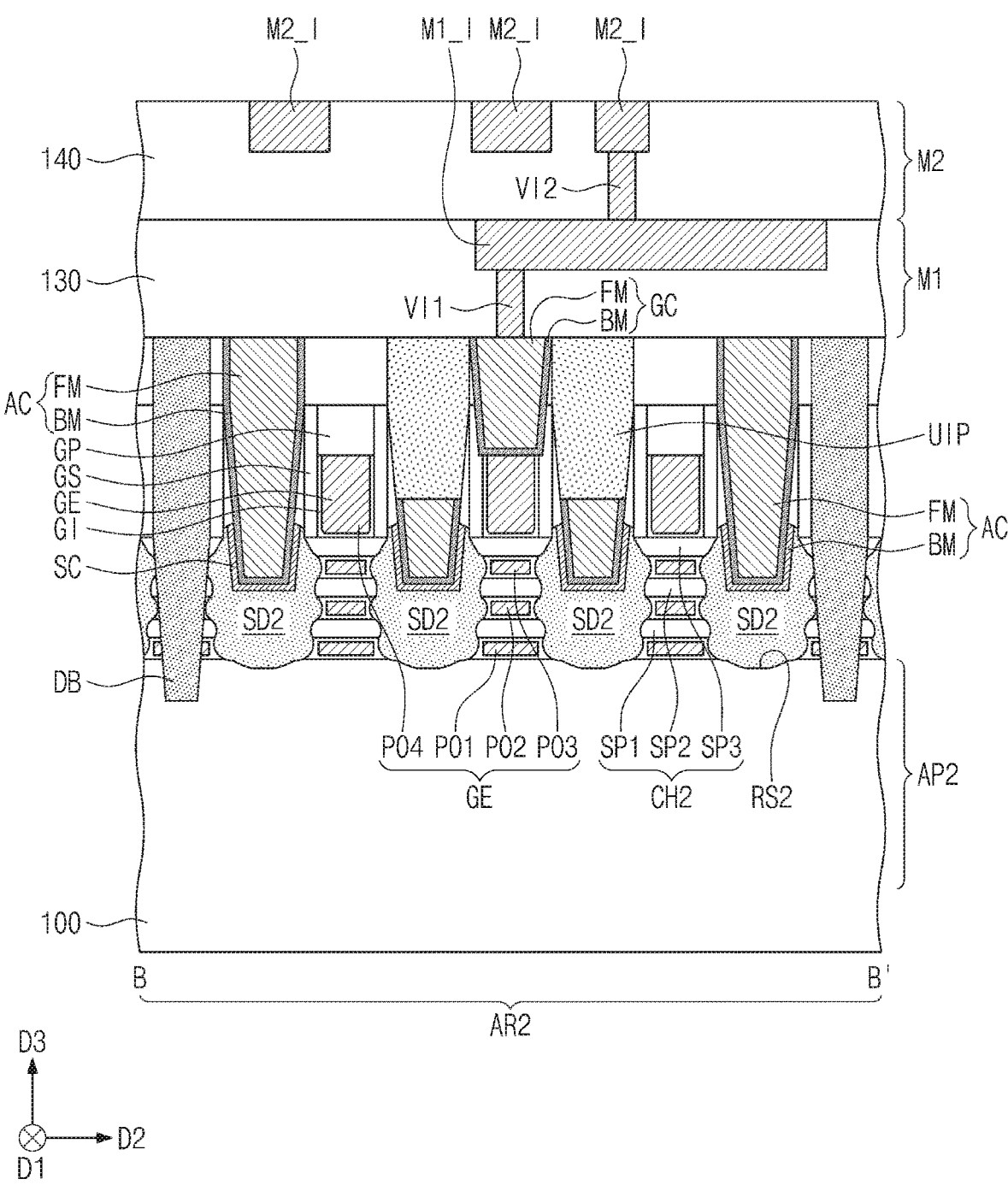

FIG. 4 is a plan view illustrating a semiconductor device according to an embodiment of the inventive concept. FIGS. 5A to 5D are sectional views taken along lines A-A', B-B', C-C', and D-D', respectively, of FIG. 4. FIG. 6 is an enlarged sectional view illustrating an example of a portion 'M' of FIG. 5D. The semiconductor device of FIGS. 4 and 5A to 5D may be a non-limiting example of the single height cell SHC of FIG. 1.

Referring to FIGS. 4 and 5A to 5D, the single height cell SHC may be provided on the substrate 100. Logic transistors constituting a logic circuit may be disposed on the single height cell SHC. The substrate 100 may be a semiconductor substrate that is formed of or includes silicon, germanium, silicon germanium, a compound semiconductor material, or the like. In an embodiment, the substrate 100 may be a silicon wafer.

The substrate 100 may include the first active region AR1 and the second active region AR2. Each of the first and second active regions AR1 and AR2 may be extended in the second direction D2. In an embodiment, the first active region AR1 may be an NMOSFET region, and the second active region AR2 may be a PMOSFET region.

Figure 5C:
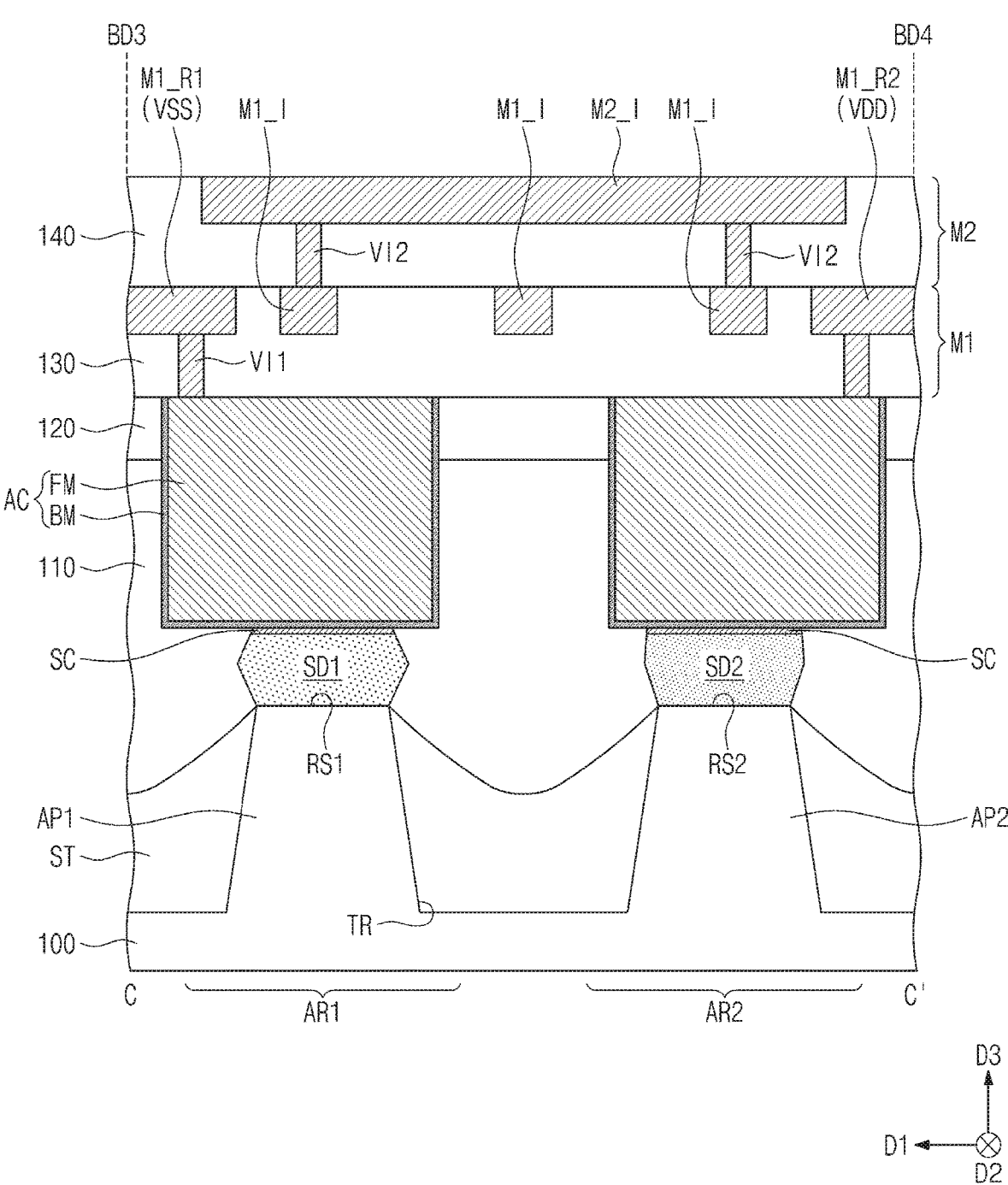
Figure 6:
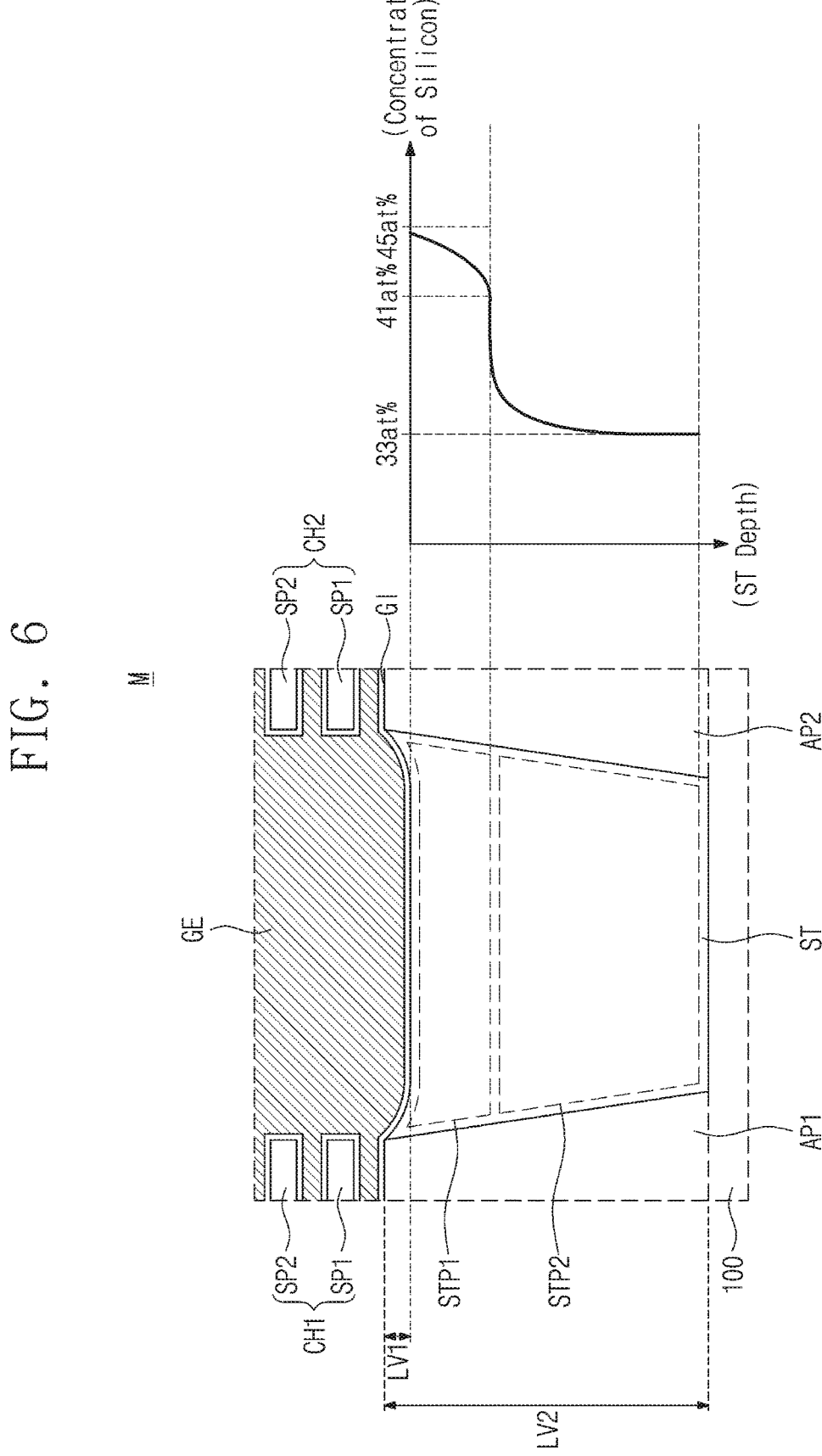
FIG. 6 is an enlarged sectional view illustrating a portion 'M' of FIG. 5A, according to an embodiment of the present inventive concept.

A first active pattern AP1 and a second active pattern AP2 may be separated by a trench TR, which is formed in an upper portion of the substrate 100 (e.g., see FIG. 5C). The first active pattern AP1 may be provided on the first active region AR1, and the second active pattern AP2 may be provided on the second active region AR2. The first and second active patterns AP1 and AP2 may be extended in the second direction D2. Each of the first and second active patterns AP1 and AP2 may be a vertically-protruding portion of the substrate 100.

A device isolation layer ST may be provided on the substrate 100, where the device isolation layer ST may be in the trench TR. The device isolation layer ST may be provided to fill the trench TR. The device isolation layer ST may include a silicon oxide layer or a silicon oxynitride layer. The device isolation layer ST may not cover first and second channel patterns CH1 and CH2 (e.g., see FIG. 5D), and to be described below. The device isolation layer ST will be described in more detail with reference to FIG. 6.

A first channel pattern CH1 may be provided on the first active pattern AP1. A second channel pattern CH2 may be provided on the second active pattern AP2 (e.g., see FIG. 5D). Each of the first and second channel patterns CH1 and CH2 may include a first semiconductor pattern SP1, a second semiconductor pattern SP2, and a third semiconductor pattern SP3, which are sequentially stacked. The first to third semiconductor patterns SP1, SP2, and SP3 may be spaced apart from each other in a vertical direction (i.e., a third direction D3).

Each of the first to third semiconductor patterns SP1, SP2, and SP3 may be formed of or include at least one of silicon (Si), germanium (Ge), or silicon germanium (SiGe). For example, each of the first to third semiconductor patterns SP1, SP2, and SP3 may be formed of or include crystalline silicon (e.g., single crystal silicon). In an embodiment, the first to third semiconductor patterns SP1, SP2, and SP3 may be nanosheets that are stacked.

A plurality of first source/drain patterns SD1 may be provided on the first active pattern AP1 (e.g., see FIGS. 5C and 5A). A plurality of first recesses RS1 may be formed in an upper portion of the first active pattern AP1. The first source/drain patterns SD1 may be provided in the first recesses RS1, respectively. The first source/drain patterns SD1 may be impurity regions of a first conductivity type (e.g., n-type). In various embodiments, the first channel pattern CH1 may be interposed between at least one pair of the first source/drain patterns SD1. In other words, at least one pair of the first source/drain patterns SD1 may be connected to each other by the stacked first to third semiconductor patterns SP1, SP2, and SP3.

A plurality of second source/drain patterns SD2 may be provided on the second active pattern AP2 (e.g., see FIGS. 5C and 5B). A plurality of second recesses RS2 may be formed in an upper portion of the second active pattern AP2. The second source/drain patterns SD2 may be provided in the second recesses RS2, respectively. The second source/drain patterns SD2 may be impurity regions of a second conductivity type (e.g., p-type). In various embodiments, the second channel pattern CH2 may be interposed between at least one pair of the second source/drain patterns SD2. In other words, at least one pair of the second source/drain patterns SD2 may be connected to each other by the stacked first to third semiconductor patterns SP1, SP2, and SP3.

The first and second source/drain patterns SD1 and SD2 may be epitaxial patterns, which are formed by a selective epitaxial growth (SEG) process. In various embodiments, the first and second source/drain patterns SD1 and SD2 may have a top surface that is higher than a top surface of the third semiconductor pattern SP3 (e.g., see FIG. 5B). In various embodiments, a top surface of at least one of the first or second source/drain patterns SD1 and SD2 may be located at substantially the same level as the top surface of the third semiconductor pattern SP3 (e.g., see FIG. 5A).

In various embodiments, the first source/drain patterns SD1 may be formed of or include substantially the same semiconductor material (e.g., Si) as the substrate 100. The second source/drain patterns SD2 may include a semiconductor material (e.g., SiGe) whose lattice constant is greater than the semiconductor material (e.g., Si) of the substrate 100. In this case, the pair of the second source/drain patterns SD2 may exert a compressive stress on the second channel pattern CH2 therebetween.

In various embodiments, the second source/drain pattern SD2 may have an uneven or embossing side surface (e.g., see FIG. 5B). In other words, the side surface of the second source/drain pattern SD2 may have a wavy profile. The side surface of the second source/drain pattern SD2 may protrude toward first to third portions PO1, PO2, and PO3 of gate electrode GE to be described below.

In various embodiments, gate electrodes GE may be provided on the first and second channel patterns CH1 and CH2. Each of the gate electrodes GE may be extended in the first direction D1 to cross the first and second channel patterns CH1 and CH2 (e.g., see FIG. 5D). Each of the gate electrodes GE may be vertically overlapped with the first and second channel patterns CH1 and CH2. The gate electrodes GE may be arranged at a first pitch in the second direction D2 (e.g., see FIGS. 5A and 5B).

The gate electrode GE may include a first portion PO1 interposed between the active pattern AP1 or AP2 and the first semiconductor pattern SP1, a second portion PO2 interposed between the first and second semiconductor patterns SP1 and SP2, a third portion PO3 interposed between the second and third semiconductor patterns SP2 and SP3, and a fourth portion PO4 on the third semiconductor pattern SP3.

Figure 5D:
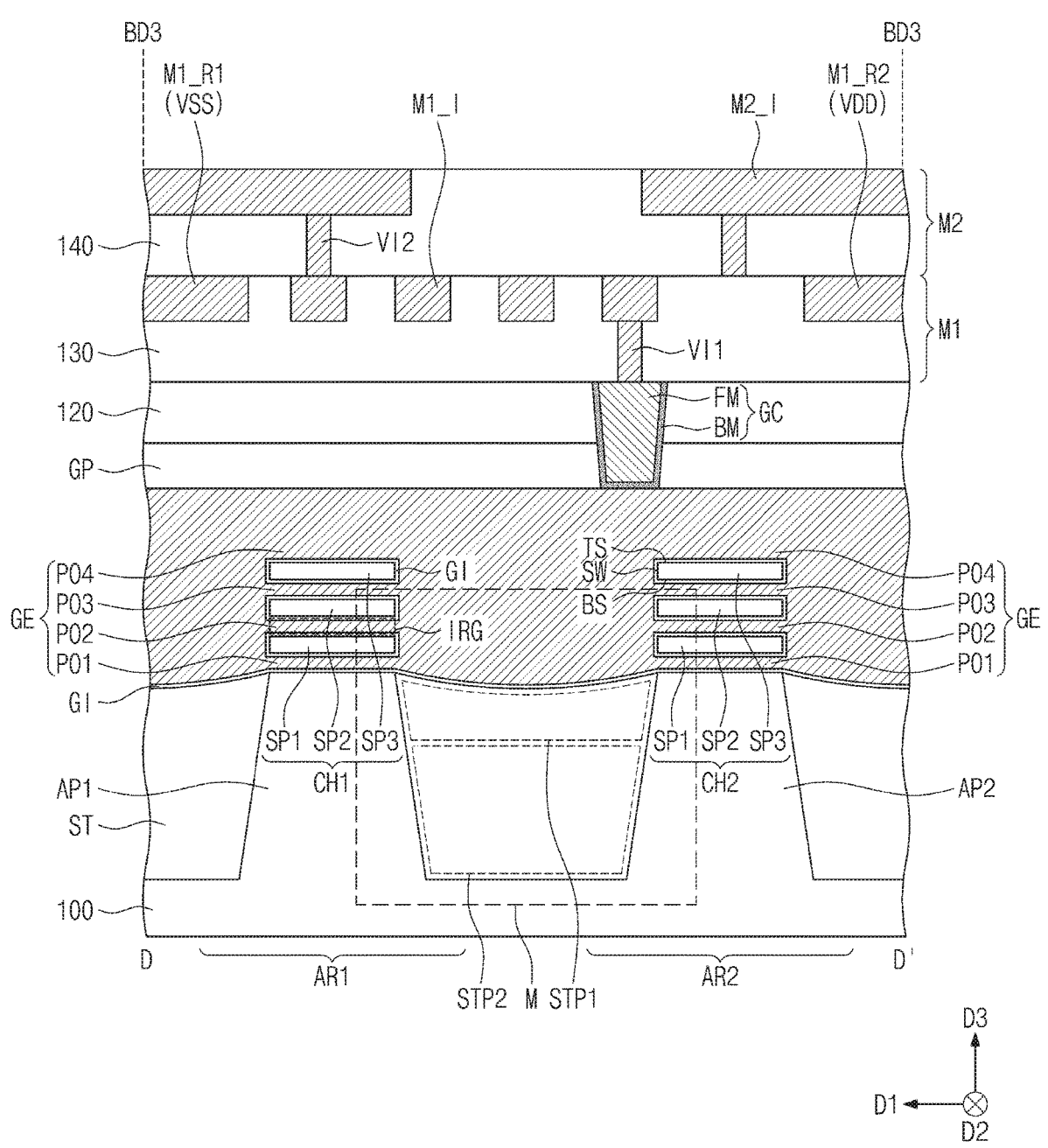

Referring to FIG. 5D, the gate electrode GE may be provided on a top surface TS, a bottom surface BS, and opposite side surfaces SW of each of the first to third semiconductor patterns SP1, SP2, and SP3. That is, the transistor according to the present embodiment may be a three-dimensional field effect transistor (e.g., MBCFET or GAAFET) in which the gate electrode GE three-dimensionally surrounds the channel pattern.

On the first active region AR1, inner spacers ISP may be respectively interposed between the first to third portions PO1, PO2, and PO3 of the gate electrode GE and the first source/drain pattern SD1 (e.g., see FIG. 5A). Each of the first to third portions PO1, PO2, and PO3 of the gate electrode GE may be spaced apart from the first source/drain pattern SD1 with the inner spacer ISP interposed therebetween. The inner spacer ISP may prevent a leakage current from the gate electrode GE.

Referring to FIGS. 5A and 5B, a pair of gate spacers GS may be respectively disposed on opposite side surfaces of the fourth portion PO4 of the gate electrode GE. The gate spacers GS may be extended along the gate electrode GE in the first direction D1. Top surfaces of the gate spacers GS may be higher than a top surface of the gate electrode GE. The top surfaces of the gate spacers GS may be coplanar with a top surface of a first interlayer insulating layer 110 shown in FIG. 5D, which will be described below. In an embodiment, the gate spacers GS may be formed of or include at least one of SiCN, SiCON, or SiN. In various embodiments, the gate spacers GS may be a multi-layered structure, which is formed of or includes at least two different materials selected from SiCN, SiCON, and SiN. In various embodiments, the gate spacer GS may be formed of or include a Si-containing insulating material. The gate spacer GS may be used as an etch stop layer in a process of forming active contacts AC to be described below. Due to the gate spacer GS, the active contacts AC may be formed in a self-aligned manner Referring to FIGS. 5A to 5D, a gate capping pattern GP may be provided on the gate electrode GE. The gate capping pattern GP may be extended along the gate electrode GE or in the first direction D1. The gate capping pattern GP may be formed of or include a material having an etch selectivity with respect to first and second interlayer insulating layers 110 and 120, which will be described below. In detail, the gate capping pattern GP may be formed of or include at least one of SiON, SiCN, SiCON, or SiN.

A gate insulating layer GI may be interposed between the gate electrode GE and the first channel pattern CH1 and between the gate electrode GE and the second channel pattern CH2. The gate insulating layer GI may cover the top surface TS, the bottom surface BS, and the opposite side surfaces SW of each of the first to third semiconductor patterns SP1, SP2, and SP3. The gate insulating layer GI may cover a top surface of the device isolation layer ST below the gate electrode GE.

In an embodiment, the gate insulating layer GI may include a silicon oxide layer, a silicon oxynitride layer, and/or a high-k dielectric layer. For example, the gate insulating layer GI may have a structure, in which a silicon oxide layer and a high-k dielectric layer are stacked. The high-k dielectric layer may be formed of or include one or more high-k dielectric materials whose dielectric constants are higher than that of silicon oxide. As a non-limiting example, the high-k dielectric layer may be formed of or include at least one of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

In various embodiments, the semiconductor device may include a negative capacitance (NC) FET using a negative capacitor. For example, the gate insulating layer GI may include a ferroelectric layer exhibiting a ferroelectric property and a paraelectric layer exhibiting a paraelectric property.

The ferroelectric layer may have a negative capacitance, and the paraelectric layer may have a positive capacitance. In the case where two or more capacitors are connected in series and each capacitor has a positive capacitance, a total capacitance may be reduced to a value that is less than a capacitance of each of the capacitors. By contrast, in the case where at least one of the serially-connected capacitors has a negative capacitance, a total capacitance of the serially-connected capacitors may have a positive value and may be greater than an absolute value of each capacitance.

In the case where a ferroelectric layer having a negative capacitance and a paraelectric layer having a positive capacitance are connected in series, a total capacitance of the serially-connected ferroelectric and paraelectric layers may be increased. Due to such an increase of the total capacitance, a transistor including the ferroelectric layer may have a subthreshold swing (SS), which is less than 60 mV/decade, at the room temperature.

The ferroelectric layer may have the ferroelectric property. The ferroelectric layer may be formed of or include at least one of, for example, hafnium oxide, hafnium zirconium oxide, barium strontium titanium oxide, barium titanium oxide, or lead zirconium titanium oxide. Here, the hafnium zirconium oxide may be hafnium oxide that is doped with zirconium (Zr). Alternatively, the hafnium zirconium oxide may be a compound composed of hafnium (Hf), zirconium (Zr), and/or oxygen (O).

The ferroelectric layer may further include dopants. For example, the dopants may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), or tin (Sn). The kind of the dopants in the ferroelectric layer may vary depending on a ferroelectric material included in the ferroelectric layer.

In the case where the ferroelectric layer includes hafnium oxide, the dopants in the ferroelectric layer may include at least one of, for example, gadolinium (Gd), silicon (Si), zirconium (Zr), aluminum (Al), or yttrium (Y).

In the case where the dopants are aluminum (Al), a content of aluminum in the ferroelectric layer may be in a range of about 3 at % to about 8 at % (atomic percentage). Here, the content of the dopants (e.g., aluminum atoms) may be a ratio of the number of aluminum atoms to the number of hafnium and aluminum atoms.

In the case where the dopants are silicon (Si), a content of silicon in the ferroelectric layer may be in a range of about 2 at % to about 10 at %. In the case where the dopants are yttrium (Y), a content of yttrium in the ferroelectric layer may be in a range of about 2 at % to about 10 at %. In the case where the dopants are gadolinium (Gd), a content of gadolinium in the ferroelectric layer may be in a range of about 1 at % to about 7 at %. In the case where the dopants are zirconium (Zr), a content of zirconium in the ferroelectric layer may be in a range of about 50 at % to about 80 at %.

The paraelectric layer may have the paraelectric property. The paraelectric layer may be formed of or include at least one of, for example, silicon oxide or high-k metal oxides. The metal oxides, which can be used as the paraelectric layer, may include at least one of, for example, hafnium oxide, zirconium oxide, or aluminum oxide, but the inventive concept is not limited to these examples.

In various embodiments, the ferroelectric layer and the paraelectric layer may be formed of or include substantially the same material. The ferroelectric layer may have the ferroelectric property, but the paraelectric layer may not have the ferroelectric property. For example, in the case where the ferroelectric and paraelectric layers contain hafnium oxide, a crystal structure of the hafnium oxide in the ferroelectric layer may be different from a crystal structure of the hafnium oxide in the paraelectric layer.

The ferroelectric layer may exhibit the ferroelectric property, when its thickness is in a specific range. In an embodiment, the ferroelectric layer may have a thickness ranging from 0.5 to 10 nm, but the inventive concept is not limited to this example. Since a critical thickness associated with the occurrence of the ferroelectric property varies depending on the kind of the ferroelectric material, the thickness of the ferroelectric layer may be changed depending on the kind of the ferroelectric material.

As a non-limiting example, the gate insulating layer GI may include a single ferroelectric layer. As another example, the gate insulating layer GI may include a plurality of ferroelectric layers spaced apart from each other. The gate insulating layer GI may have a multi-layered structure, in which a plurality of ferroelectric layers and a plurality of paraelectric layers are alternately stacked.

Referring back to FIGS. 4 and 5A to 5D, the gate electrode GE may include a first metal pattern and a second metal pattern on the first metal pattern. The first metal pattern may be provided on the gate insulating layer GI and may be adjacent to the first to third semiconductor patterns SP1, SP2, and SP3. The first metal pattern may include a work-function metal, which can be used to adjust a threshold voltage of the transistor. By adjusting a thickness and composition of the first metal pattern, it may be possible to realize a transistor having a predetermined threshold voltage. For example, the first to third portions PO1, PO2, and PO3 of the gate electrode GE may be composed of the first metal pattern or the work-function metal.

The first metal pattern may include a metal nitride layer. For example, the first metal pattern may include a layer that is composed of a metallic material, including, but not limited to, titanium (Ti), tantalum (Ta), aluminum (Al), tungsten (W) and molybdenum (Mo), nitrogen (N), and combinations thereof. In an embodiment, the first metal pattern may further include carbon (C). The first metal pattern may include a plurality of work function metal layers which are stacked.

The second metal pattern may be formed of or include a metallic material whose resistance is lower than the first metal pattern. For example, the second metal pattern may be formed of or include at least one metallic material, including, but not limited to, tungsten (W), aluminum (Al), titanium (Ti), and tantalum (Ta). The fourth portion PO4 of the gate electrode GE may include the first metal pattern and the second metal pattern on the first metal pattern.

A first interlayer insulating layer 110 may be provided on the substrate 100. The first interlayer insulating layer 110 may cover the gate spacers GS and the first and second source/drain patterns SD1 and SD2. The first interlayer insulating layer 110 may have a top surface that is substantially coplanar with the top surface of the gate capping pattern GP and the top surface of the gate spacer GS. A second interlayer insulating layer 120 may be formed on the first interlayer insulating layer 110 to cover the gate capping pattern GP. A third interlayer insulating layer 130 may be provided on the second interlayer insulating layer 120. A fourth interlayer insulating layer 140 may be provided on the third interlayer insulating layer 130. In an embodiment, at least one of the first to fourth interlayer insulating layers 110 to 140 may include a silicon oxide layer.

Referring to FIGS. 4 and 5A to 5D, the single height cell SHC may have a first border BD1 and a second border BD2, which are opposite to each other in the second direction D2. The first and second borders BD1 and BD2 may be extended in the first direction D1. The single height cell SHC may have a third border BD3 and a fourth border BD4, which are opposite to each other in the first direction D1. The third and fourth borders BD3 and BD4 may be extended in the second direction D2.

A pair of division structures DB, which are opposite to each other in the second direction D2, may be provided at both sides of the single height cell SHC. For example, the pair of the division structures DB may be respectively provided on the first and second borders BD1 and BD2 of the single height cell SHC. The division structure DB may be extended in the first direction D1 to be parallel to the gate electrodes GE. A pitch between the division structure DB and the gate electrode GE adjacent thereto may be equal to the first pitch.

The division structure DB may penetrate the first and second interlayer insulating layers 110 and 120 and may be extended into the first and second active patterns AP1 and AP2. The division structure DB may penetrate an upper portion of each of the first and second active patterns AP1 and AP2. The division structure DB may electrically separate an active region of each of the single height cell SHC from an active region of a neighboring cell.

Active contacts AC may penetrate the first and second interlayer insulating layers 110 and 120 and be electrically connected to the first and second source/drain patterns SD1 and SD2, respectively. A pair of the active contacts AC may be respectively provided at both sides of the gate electrode GE. When viewed in a plan view, the active contact AC may be a bar-shaped pattern that is extended in the first direction D1.

The active contact AC may be a self-aligned contact. For example, the active contact AC may be formed by a self-alignment process using the gate capping pattern GP and the gate spacer GS. For example, the active contact AC may cover at least a portion of the side surface of the gate spacer GS. Although not shown, the active contact AC may cover a portion of the top surface of the gate capping pattern GP.

Metal-semiconductor compound layers SC (e.g., silicide layers) may be respectively interposed between the active contact AC and the first source/drain pattern SD1 and between the active contact AC and the second source/drain pattern SD2. The active contact AC may be electrically connected to the source/drain pattern SD1 or SD2 through the metal-semiconductor compound layer SC. For example, the metal-semiconductor compound layer SC may be formed of or include at least one of titanium silicide, tantalum silicide, tungsten silicide, nickel silicide, or cobalt silicide.

Gate contacts GC may penetrate the second interlayer insulating layer 120 and the gate capping pattern GP and to be electrically connected to the gate electrodes GE, respectively (e.g., see FIG. 5D). When viewed in a plan view, the gate contacts GC may be disposed to be respectively overlapped with the first and second active regions AR1 and AR2. As an example, the gate contact GC may be provided on the second active pattern AP2 (e.g., see FIG. 5B).

In an embodiment, referring to FIG. 5B, an upper portion of the active contact AC adjacent to the gate contact GC may be filled with an upper insulating pattern UIP. A bottom surface of the upper insulating pattern UIP may be lower than a bottom surface of the gate contact GC. In other words, a top surface of the active contact AC adjacent to the gate contact GC may be formed at a level, which is lower than the bottom surface of the gate contact GC, by the upper insulating pattern UIP. Accordingly, it may be possible to prevent the gate contact GC and the active contact AC, which are adjacent to each other, from being in contact with each other and thereby to prevent a short circuit issue from occurring therebetween.

Each of the active and gate contacts AC and GC may include a conductive pattern FM and a barrier pattern BM enclosing the conductive pattern FM. For example, the conductive pattern FM may be formed of or include one or more metallic materials (e.g., aluminum, copper, tungsten, molybdenum, and cobalt). The barrier pattern BM may be provided to cover side and bottom surfaces of the conductive pattern FM. In an embodiment, the barrier pattern BM may include a metal layer and a metal nitride layer. The metal layer may be formed of or include at least one of titanium, tantalum, tungsten, nickel, cobalt, or platinum. The metal nitride layer may be formed of or include at least one of titanium nitride (TiN), tantalum nitride (TaN), tungsten nitride (WN), nickel nitride (NiN), cobalt nitride (CoN), or platinum nitride (PtN).

A first metal layer M1 may be provided in the third interlayer insulating layer 130. For example, the first metal layer M1 may include the first power line M1_R1, the second power line M1_R2, and first interconnection lines MU. Each of the interconnection lines M1_R1, M1_R2, and M1_I of the first metal layer M1 may be extended in the second direction D2 and parallel to each other.

In detail, the first and second power lines M1_R1 and M1_R2 may be respectively provided on the third and fourth borders BD3 and BD4 of the single height cell SHC (e.g., see FIG. 4). The first power line M1_R1 may be extended along the third border BD3 and in the second direction D2. The second power line M1_R2 may be extended along the fourth border BD4 and in the second direction D2.

The first interconnection lines M1_I of the first metal layer M1 may be disposed between the first and second power lines M1_R1 and M1_R2. The first interconnection lines M1_I of the first metal layer M1 may be arranged at a second pitch in the first direction D1. The second pitch may be smaller than the first pitch. A linewidth of each of the first interconnection lines M1_I may be smaller than a linewidth of each of the first and second power lines M1_R1 and M1_R2.

The first metal layer M1 may further include first vias VI1. The first vias VI1 may be respectively disposed below the interconnection lines M1_R1, M1_R2, and M1_I of the first metal layer M1. The active contact AC and the interconnection line of the first metal layer M1 may be electrically connected to each other through the first via VI1. The gate contact GC and the interconnection line of the first metal layer M1 may be electrically connected to each other through the first via VI1.

The interconnection line of the first metal layer M1 and the first via VI1 thereunder may be formed by separate processes. For example, the interconnection line and the first via VI1 of the first metal layer M1 may be independently formed by respective single damascene processes. The semiconductor device according to the present embodiment may be fabricated using a sub-20 nm process.

A second metal layer M2 may be provided in the fourth interlayer insulating layer 140. The second metal layer M2 may include a plurality of second interconnection lines M2_I. Each of the second interconnection lines M2_I of the second metal layer M2 may be a line- or bar-shaped pattern that is extended in the first direction D1. In other words, the second interconnection lines M2_I may be extended in the first direction D1 and parallel to each other.

The second metal layer M2 may further include second vias VI2, which are respectively provided below the second interconnection lines M2_I. The interconnection lines of the first and second metal layers M1 and M2 may be electrically connected to each other through the second via VI2. The interconnection line of the second metal layer M2 and the second via VI2 thereunder may be formed together by a dual damascene process.

The interconnection lines of the first metal layer M1 may be formed of or include a conductive material that is the same as or different from those of the second metal layer M2. For example, the interconnection lines of the first and second metal layers M1 and M2 may be formed of or include one or more metallic materials (e.g., aluminum, copper, tungsten, ruthenium, molybdenum, and cobalt). Although not shown, a plurality of metal layers (e.g., M3, M4, M5, and so forth) may be additionally stacked on the fourth interlayer insulating layer 140. Each of the stacked metal layers may include interconnection lines, which are used as routing paths between cells.

The device isolation layer ST will be described in more detail with reference to FIG. 6. The device isolation layer ST may include a first portion STP1 and a second portion STP2 interposed between the first active pattern AP1 and the second active pattern AP2. The first and second portions STP1 and STP2 may be vertically overlapped with the gate electrode GE. The first portion STP1 may be provided on the second portion STP2.

Referring back to FIG. 6, a section of the first portion STP1 in the first direction D1 may have a bowl-shaped portion whose top surface is flat at a center region and is higher at an edge region than at the center region. A section of the second portion STP2 in the first direction D1 may have a trapezoidal portion whose width decreases in a direction toward the bottom surface of the trench TR.

According to an embodiment of the inventive concept, the first portion STP1 and the second portion STP2 may have different silicon concentrations from each other. The silicon concentration of the first portion STP1 may be higher than the silicon concentration of the second portion STP2. For example, the silicon concentration of the first portion STP1 can be in a range of about 41 at % (atomic percent) to about 45 at %. The silicon concentration of the second portion STP2 can be in a range of about 31 at % to about 35 at %.

According to an embodiment of the inventive concept, the device isolation layer ST may include a silicon oxide (SiOx) layer. In various embodiments, a ratio of oxygen (O) to silicon (Si) (i.e., oxygen:silicon) in the first portion STP1 may be about 57:43. The ratio of oxygen (O) to silicon (Si) (i.e., oxygen:silicon) in the second portion STP2 may be about 67:33.

The graph of FIG. 6 shows how the concentration of silicon changes according to a depth of the device isolation layer ST. As the depth of the device isolation layer (i.e., ST Depth) increases, the concentration of silicon may be decreased exponentially. For example, the silicon concentration of the device isolation layer ST may be about 43 at % in a region adjacent to the gate electrode GE. As the depth of the device isolation layer ST increases, the concentration of silicon may decrease. The silicon concentration of the device isolation layer ST may be about 31 at % in a region adjacent to the bottom surface of the trench TR.

A silicon ion implantation (IIP) technology may be used to allow the first portion STP1 to have a silicon concentration higher than that of the second portion STP2. For example, silicon ions may be injected into the first portion STP1 of the device isolation layer ST. Accordingly, the first portion STP1 may have a silicon concentration that is higher than that of the second portion STP2. In this case, it may be possible to lower an etch rate of the first portion STP1 in dry and wet etching processes. By using the IIP technology, it may be possible to form the first portion STP1 made of an enhanced silicon oxide layer. The enhancement of the silicon oxide layer may reduce or prevent loss of the device isolation layer ST. Accordingly, it may be possible to reduce a variation in the loss of the device isolation layer ST and thereby to improve electrical and reliability characteristics of the semiconductor device.

Referring to FIG. 6, as a result of the enhancement of the first portion STP1 of the device isolation layer ST, the first portion STP1 may have a flat top surface. In detail, a center region of the top surface may be formed to be flat, and an edge region of the top surface may be curvedly formed to cover side surfaces of the active patterns AP1 and AP2, such that at least a portion of the edge region has a curved shape. In other words, a center portion of the device isolation layer ST may have a non-depressed shape.

A level of the top surface of the first portion STP1 may be defined by a level of the center region of the top surface. In an embodiment, a level difference LV1 between the top surface of the first portion STP1 and the top surfaces of the active patterns AP1 and AP2 may be larger than 0 Å and may be smaller than or equal to about 200 Å. A level difference LV2 between the top surfaces of the active patterns AP1 and AP2 and the bottom surface of the trench TR may be about 800 Å.

FIGS. 7A to 12C are sectional views illustrating a method of fabricating a semiconductor device, according to an embodiment of the present inventive concept. In detail, FIGS. 7A, 8A, 9A, 10A, 11A, and 12A are sectional views taken along a line A-A' of FIG. 4. FIGS. 9B and 10B are sectional views taken along a line B-B' of FIG. 4. FIGS. 9C, 10C, 11B, and 12B are sectional views taken along a line C-C' of FIG. 4. FIGS. 7B, 8B, 11C, and 12C are sectional views taken along a line D-D' of FIG. 4.

Figure 7A:
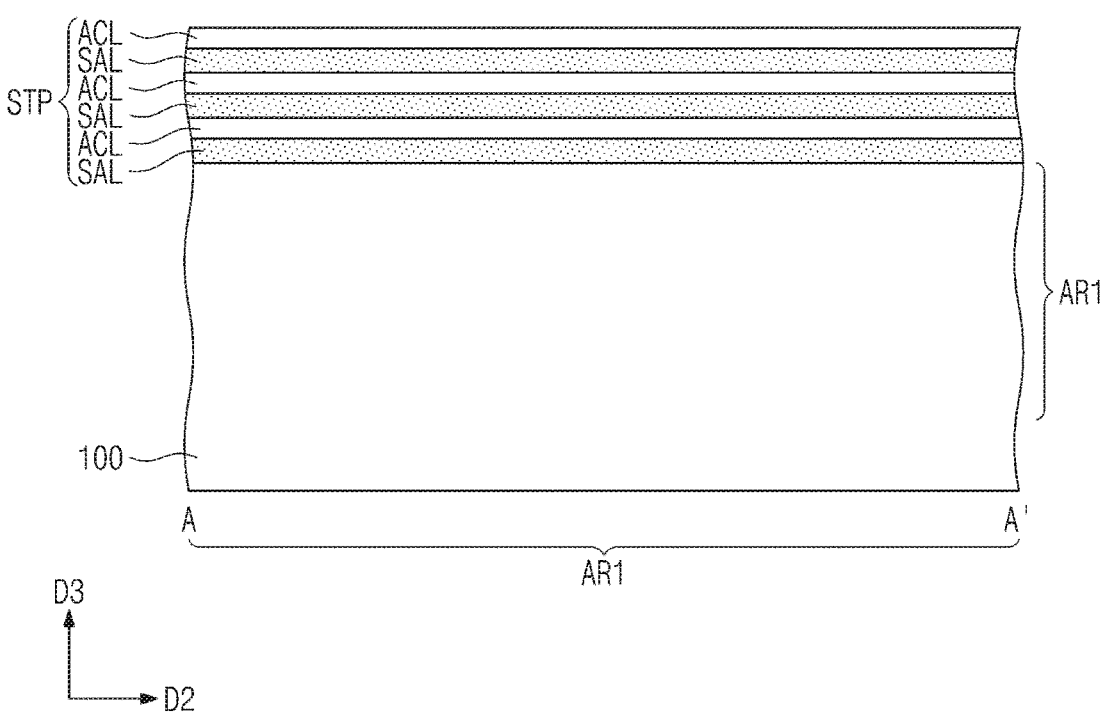
FIGS. 7A to 12C are sectional views illustrating a method of fabricating a semiconductor device, according to an embodiment of the present inventive concept.
Figure 7B:
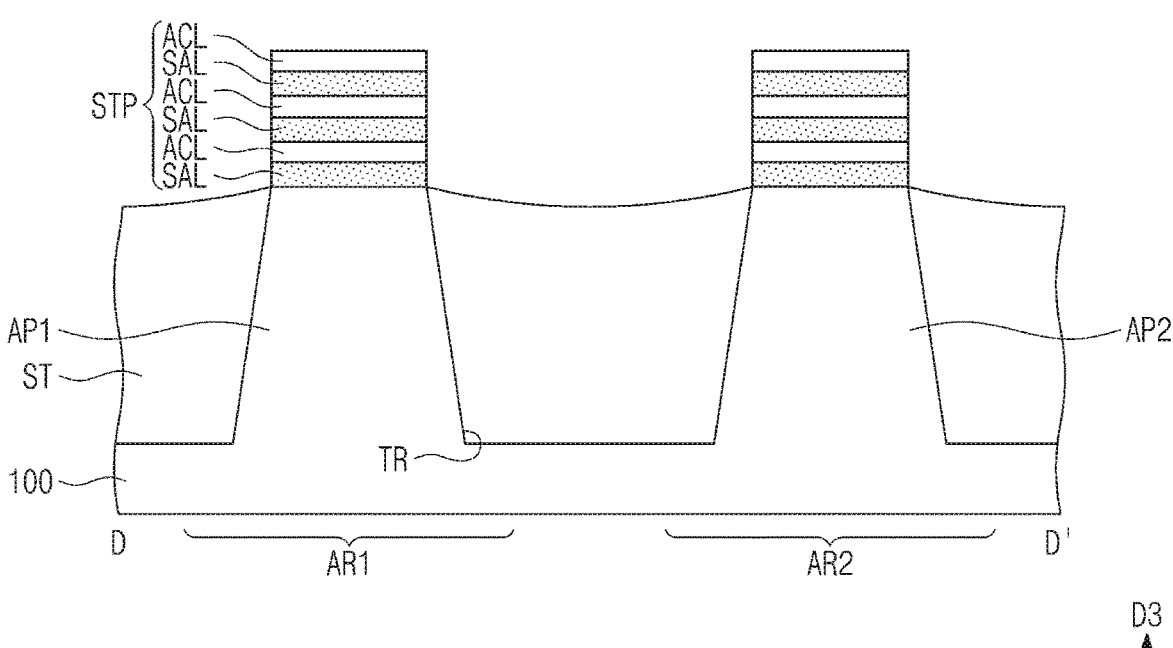

Referring to FIGS. 7A and 7B, the substrate 100 including the first and second active regions AR1 and AR2 may be provided. Active layers ACL and sacrificial layers SAL may be alternately stacked on the substrate 100. The active layers ACL may be formed of or include one of silicon (Si), germanium (Ge), or silicon germanium (SiGe), and the sacrificial layers SAL may be formed of or include another one of silicon (Si), germanium (Ge), or silicon germanium (SiGe).

The sacrificial layer SAL may be formed of or include a material having an etch selectivity with respect to the active layer ACL. For example, the active layers ACL may be formed of or include silicon (Si), and the sacrificial layers SAL may be formed of or include silicon germanium (SiGe). A germanium concentration of each of the sacrificial layers SAL can be in a range of about 10 at % to about 30 at %.

Mask patterns may be respectively formed on the first and second active regions AR1 and AR2 of the substrate 100. The mask pattern may be a line- or bar-shaped pattern that is extended in the second direction D2.

A patterning process using the mask patterns as an etch mask may be performed to form the trench TR between the first and second active patterns AP1 and AP2. The first active pattern AP1 may be formed on the first active region AR1. The second active pattern AP2 may be formed on the second active region AR2.

In various embodiments, a stacking pattern STP may be formed on each of the first and second active patterns AP1 and AP2. The stacking pattern STP may include the active layers ACL and the sacrificial layers SAL, which are alternately stacked. The stacking pattern STP may be formed along with the first and second active patterns AP1 and AP2, during the patterning process.

The device isolation layer ST may be formed in the trench TR, where the device isolation layer ST may fill the trench TR. A method of forming the device isolation layer ST will be described in more detail with reference to FIGS. 13 to 16.

Figure 13:
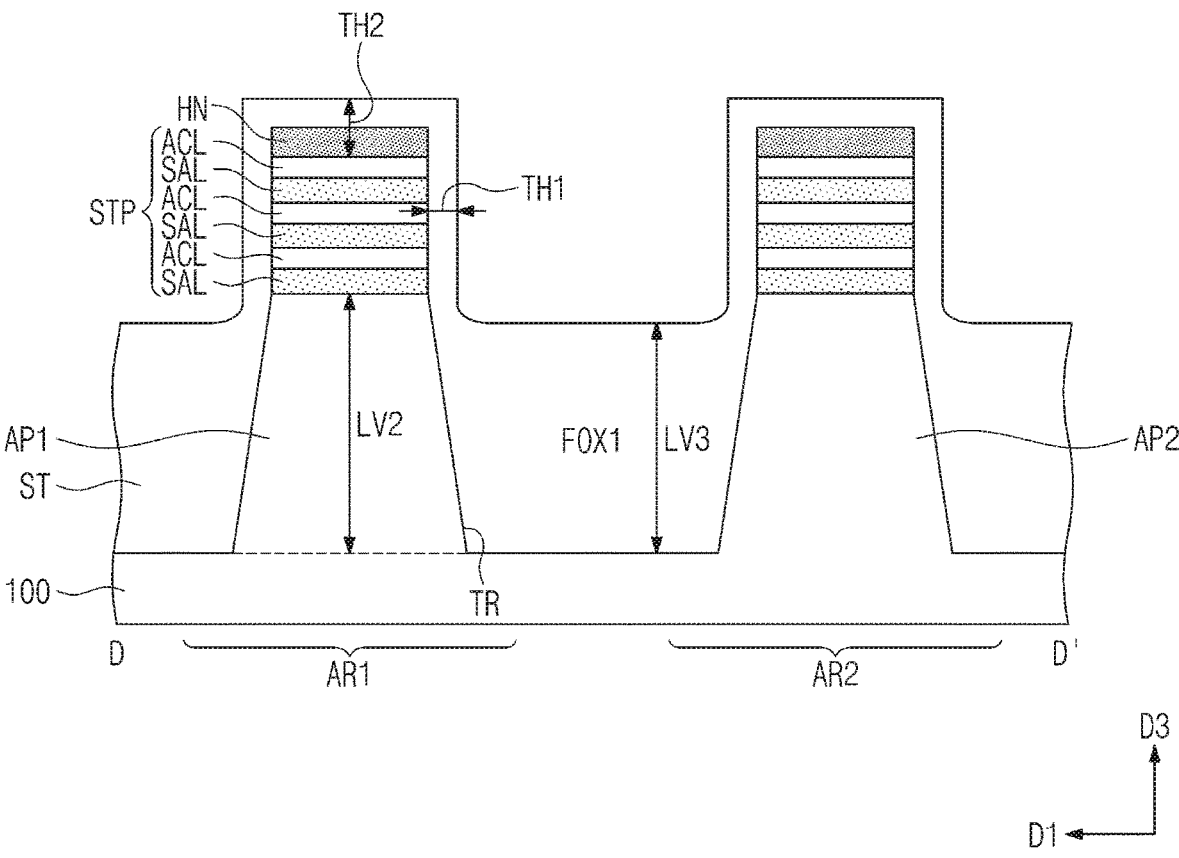
FIGS. 13 to 16 are sectional views illustrating a method of forming a device isolation layer of FIG. 7B, according to an embodiment of the present inventive concept.

Referring to FIG. 13, a hard mask HN may be provided on the stacking patterns STP. In an embodiment, the hard mask HN may be formed of or include silicon nitride (SiN). A first field insulating layer FOX1 may be formed on the substrate 100 to cover the first and second active patterns AP1 and AP2, the stacking patterns STP, and the hard mask HN. The first field insulating layer FOX1 may be deposited using at least one of atomic layer deposition (ALD), plasma-enhanced chemical vapor deposition (PE-CVD), low-pressure CVD (LP-CVD), or flowable CVD (FCVD) processes. The first field insulating layer FOX1 may be formed of or include one or more insulating materials (e.g., silicon oxide). In various embodiments, a level difference LV2 between the top surfaces of the active patterns AP1 and AP2 and the bottom surface of the trench TR may be about 800 Å. In various embodiments, a level difference LV3 between a top surface of the first field insulating layer FOX1 in the trench TR and the bottom surface of the trench TR may be about 600 Å. A thickness TH1 of the first field insulating layer FOX1 covering side surfaces of the stacking patterns STP may be about 100 Å. A thickness TH2 of the hard mask HN and the first field insulating layer FOX1, which are located on a top surface of the stacking pattern STP, may be about 300 Å.

Figure 14:
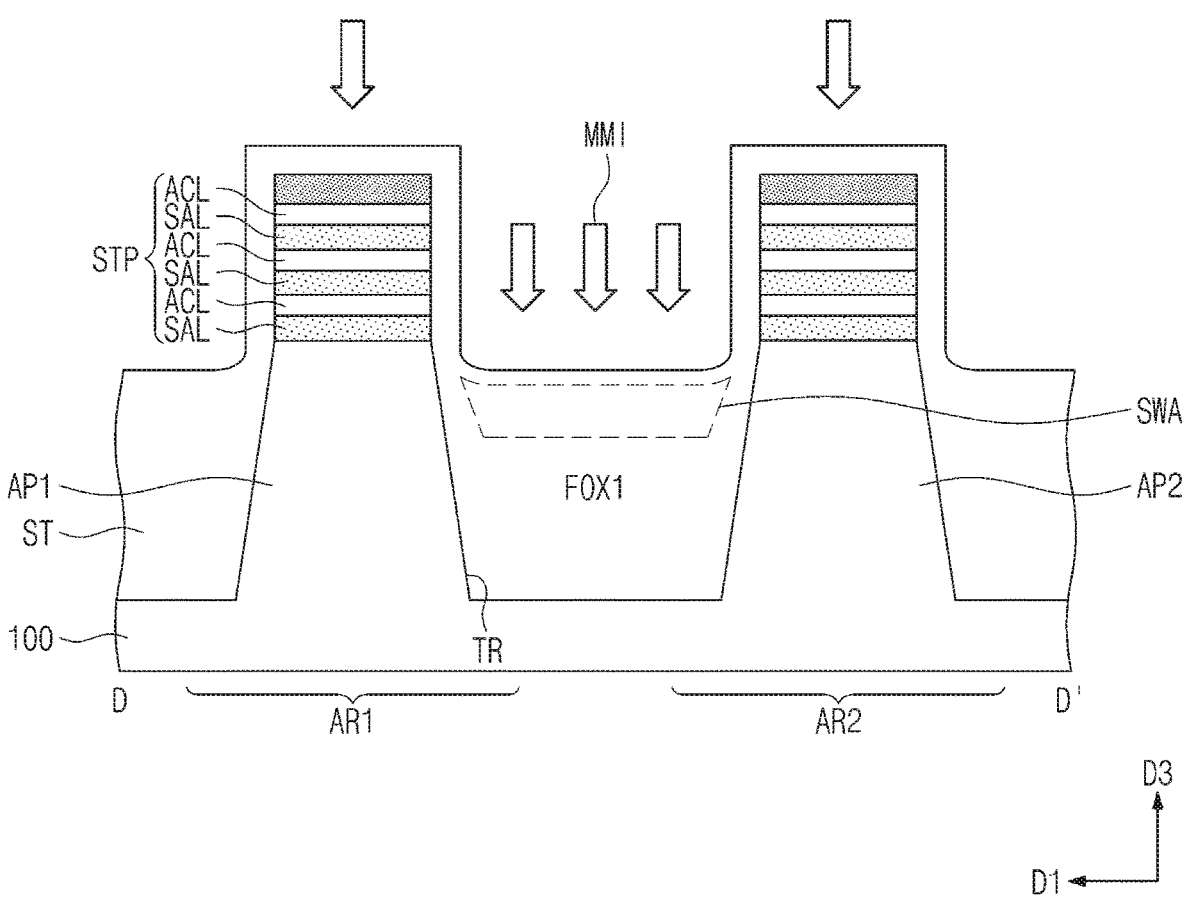

Referring to FIG. 14, a silicon ion implantation process MMI may be performed on the first field insulating layer FOX1. In an embodiment, a wet annealing process may be performed on the first field insulating layer FOX1, before the silicon ion implantation process. As a result of the silicon ion implantation process MMI, a swelling region SWA may be defined between the first and second active patterns AP1 and AP2. The swelling region SWA may be a region of the first field insulating layer FOX1 having the highest silicon concentration. For example, the silicon concentration of the swelling region SWA may be in a range of about 41 at % to about 45 at %.

When the silicon ion implantation process MMI is performed, the side surface of the stacking patterns STP may be covered with the first field insulating layer FOX1. In addition, when the silicon ion implantation process MMI is performed, the top surface of the stacking patterns STP may also be covered with the hard mask HN and the first field insulating layer FOX1. Thus, the stacking patterns STP may be protected by the hard mask HN and the first field insulating layer FOX1. In this case, it may be possible to prevent a lateral straggle issue from occurring on the side surfaces of the active and sacrificial layers ACL and SAL. Accordingly, it may be possible to prevent a Si/SiGe intermixing issue from occurring in the semiconductor device according to an embodiment of the inventive concept.

Figure 15:
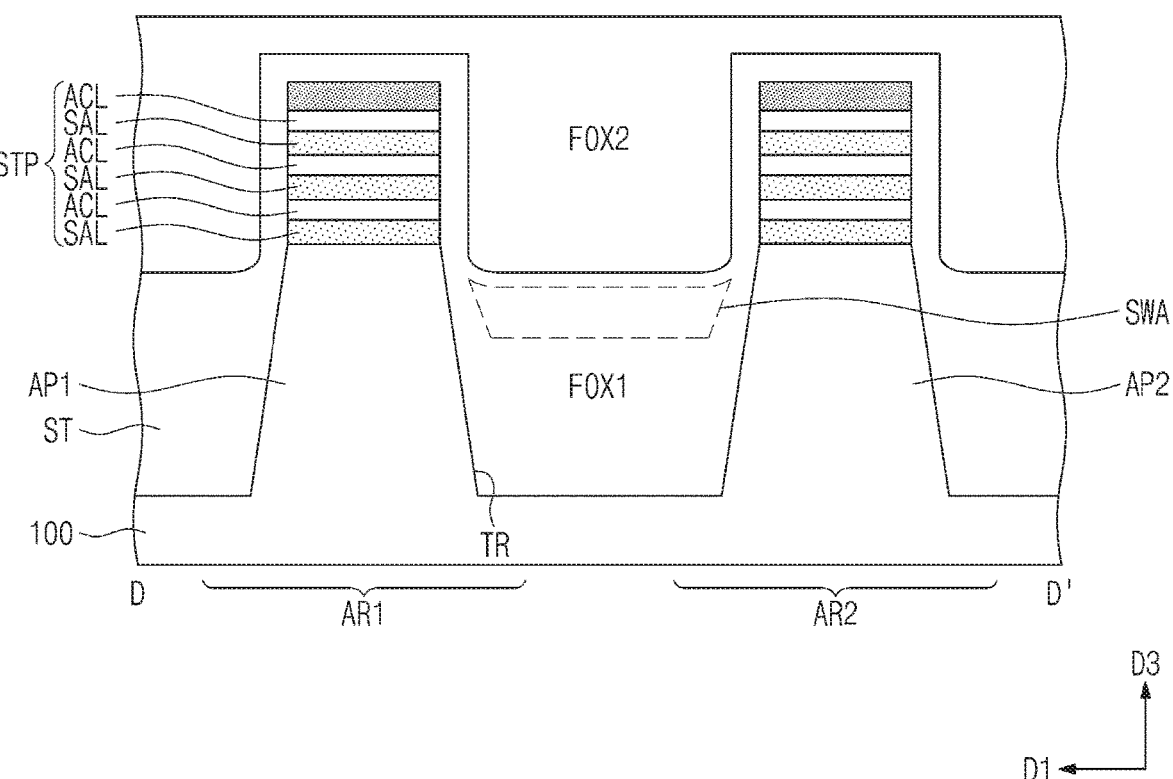

Referring to FIG. 15, a second field insulating layer FOX2 may be formed on the substrate 100 to cover the first field insulating layer FOX1. The second field insulating layer FOX2 may be deposited using at least one of atomic layer deposition (ALD), plasma-enhanced chemical vapor deposition (PE-CVD), low-pressure CVD (LP-CVD), or flowable CVD (FCVD) processes. The second field insulating layer FOX2 may be formed of or include one or more insulating materials (e.g., silicon oxide). In an embodiment, a wet annealing process may be performed on the second field insulating layer FOX2.

Figure 16:
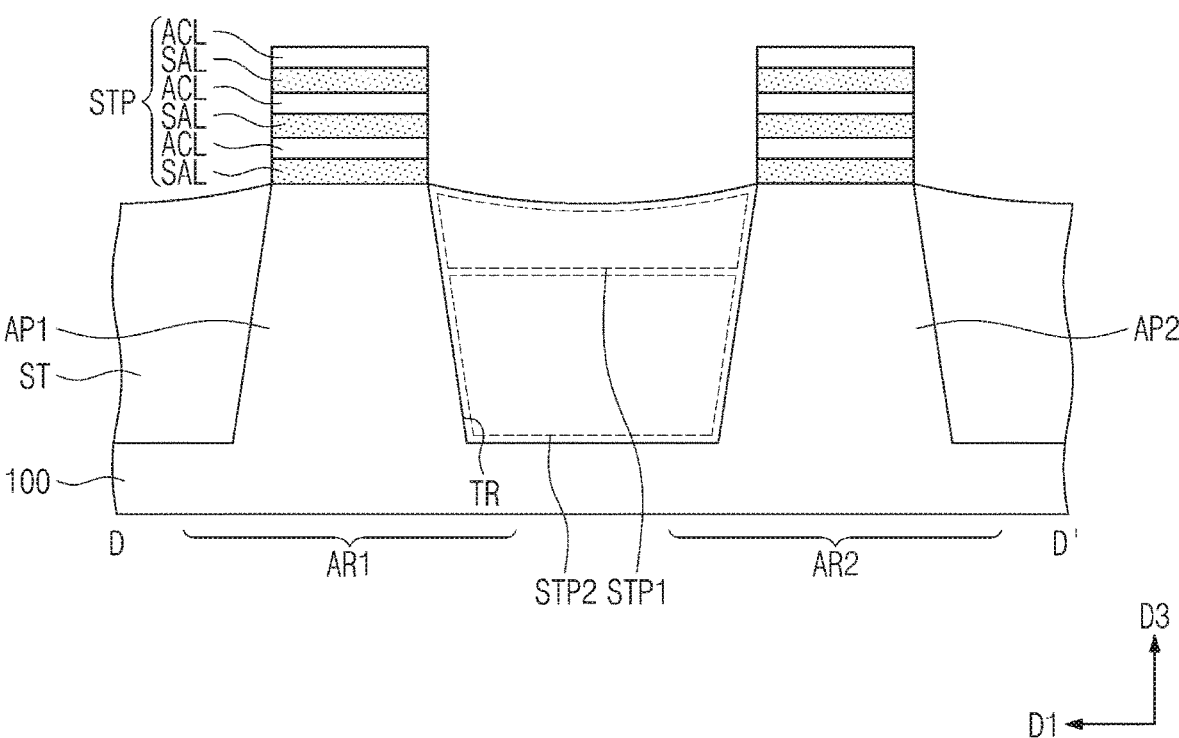

Referring to FIG. 16, the device isolation layer ST may be formed by recessing the first and second field insulating layers FOX1 and FOX2 and the hard mask HN to expose the stacking patterns STP. The swelling region SWA may correspond to the first portion STP1 of the device isolation layer ST. The stacking patterns STP may be placed above the device isolation layer ST and may be exposed to the outside of the device isolation layer ST. In other words, the stacking patterns STP may protrude vertically above the device isolation layer ST.

Figure 8A:
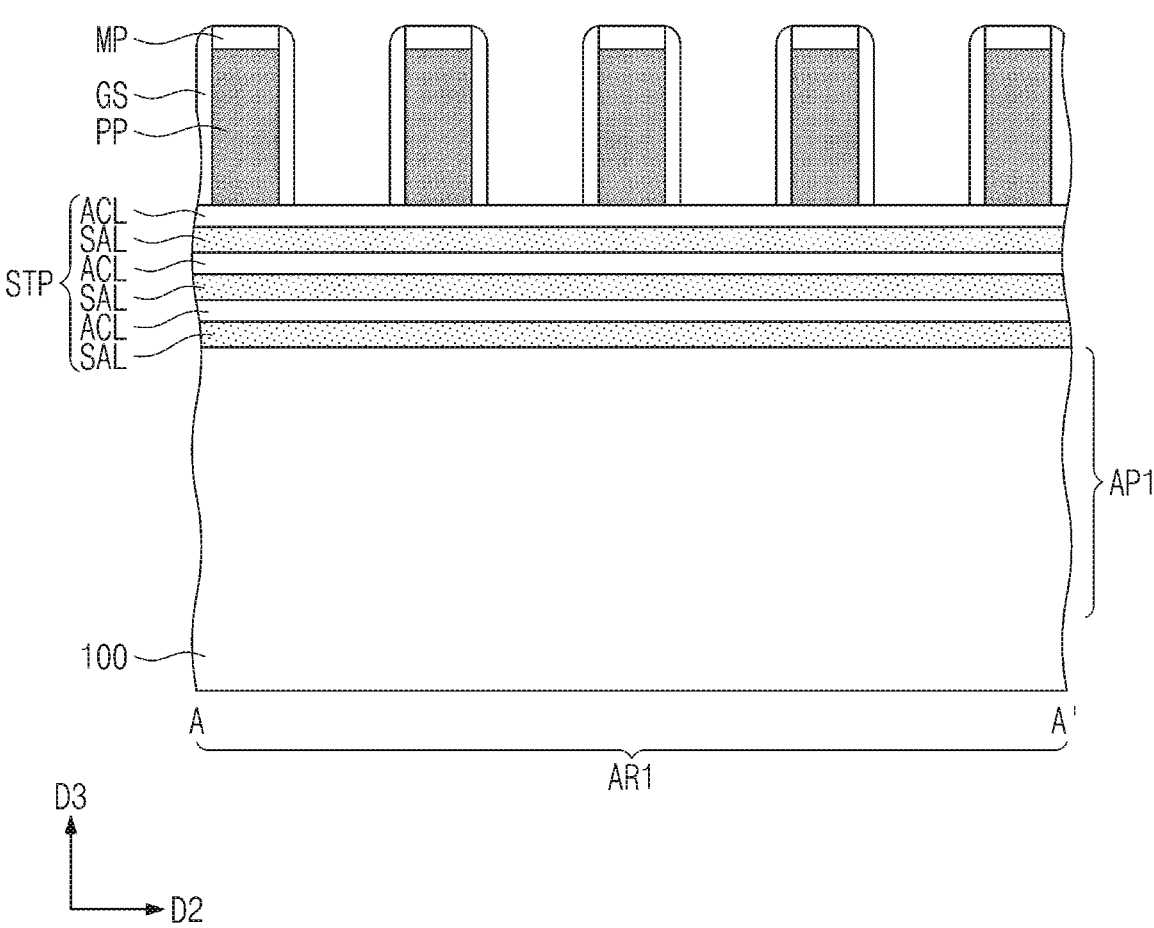
Figure 8B:
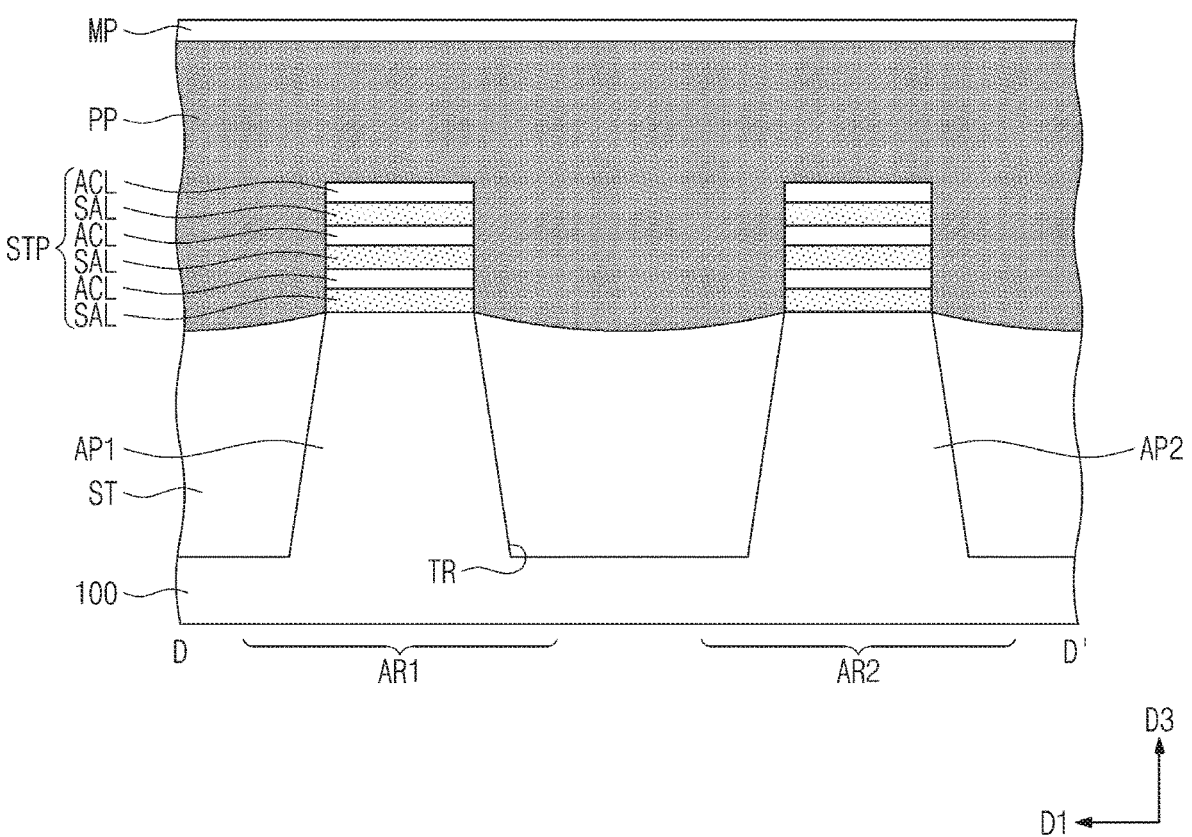

Referring to FIGS. 8A and 8B, sacrificial patterns PP may be formed on the substrate 100 to cross the stacking patterns STP. Each of the sacrificial patterns PP may be a line- or bar-shaped pattern that is extended in the first direction D1. The sacrificial patterns PP may be arranged at a first pitch in the second direction D2.

In detail, the formation of the sacrificial patterns PP may include forming a sacrificial layer on the substrate 100, forming hard mask patterns MP on the sacrificial layer, and patterning the sacrificial layer using the hard mask patterns MP as an etch mask. The sacrificial layer may be formed of or include polysilicon.

A pair of the gate spacers GS may be formed on opposite side surfaces of each of the sacrificial patterns PP. The formation of the gate spacers GS may include conformally forming a gate spacer layer on the substrate 100 and anisotropically etching the gate spacer layer. In an embodiment, the gate spacer GS may be a multi-layered structure including at least two layers.

Figure 9A:
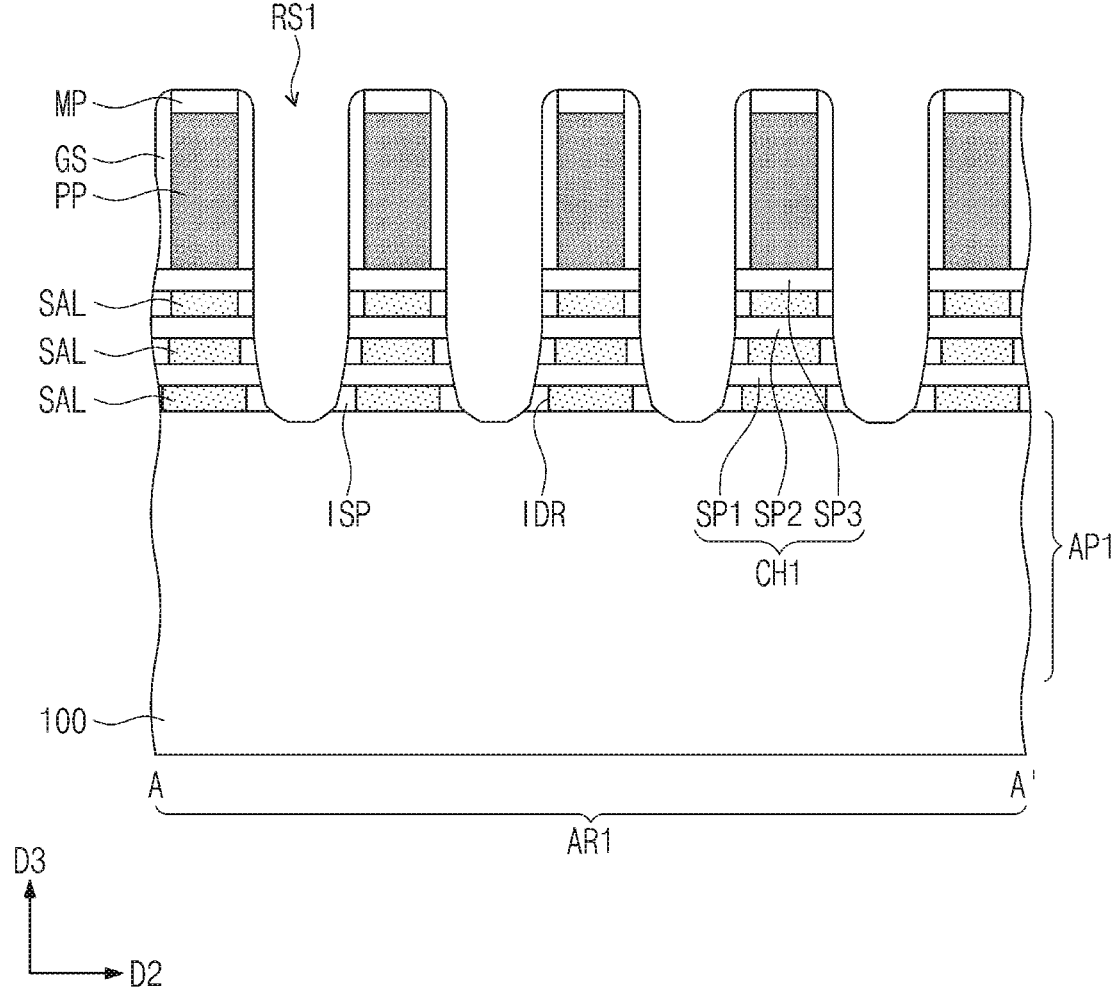
Figure 9B:
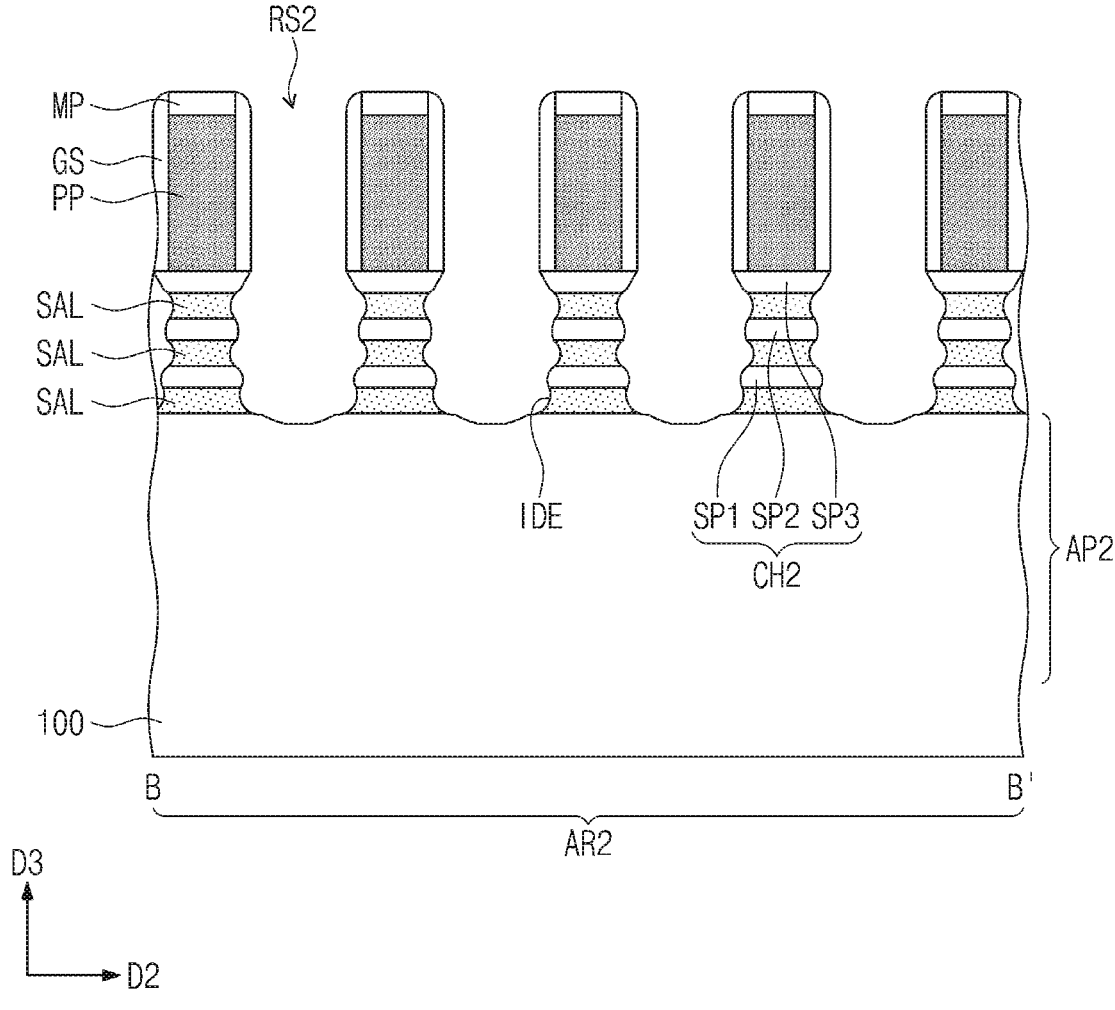
Figure 9C:
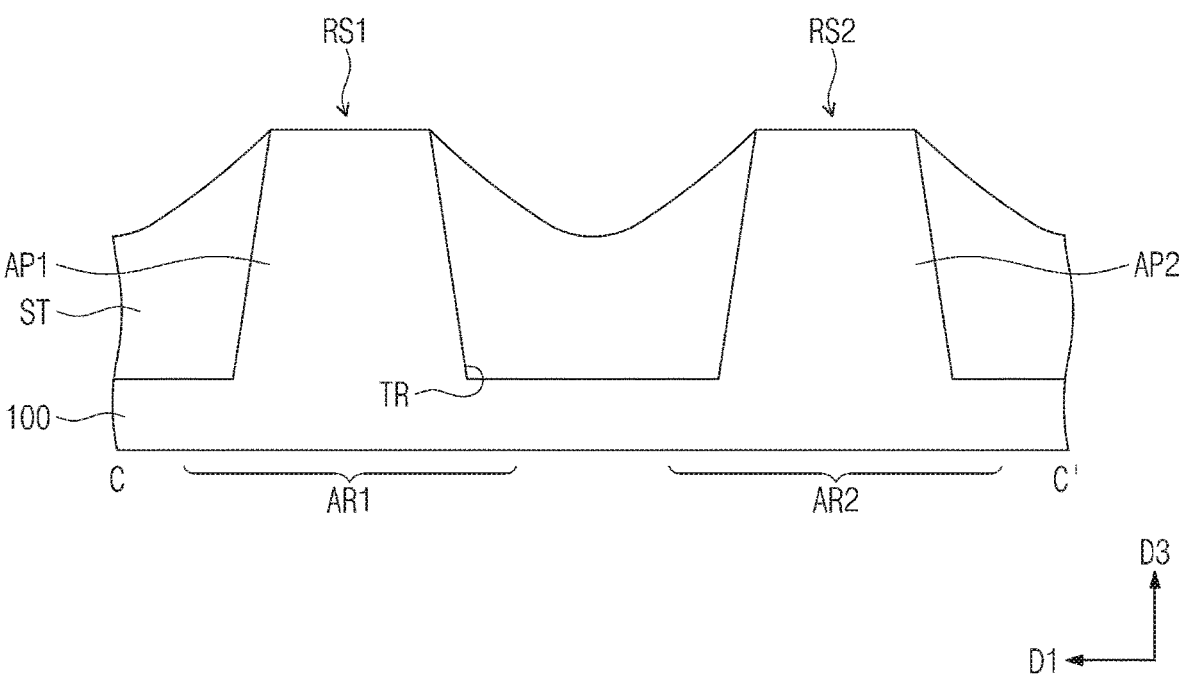

Referring to FIGS. 9A to 9C, the first recesses RS1 may be formed in the stacking pattern STP on the first active pattern AP1. The second recesses RS2 may be formed in the stacking pattern STP on the second active pattern AP2. During the formation of the first and second recesses RS1 and RS2, the device isolation layer ST may also be recessed at both sides of each of the first and second active patterns AP1 and AP2 (e.g., see FIG. 9C).

In detail, the first recesses RS1 may be formed by etching the stacking pattern STP on the first active pattern AP1 using the hard mask patterns MP and the gate spacers GS as an etch mask. The first recess RS1 may be formed between a pair of the sacrificial patterns PP.

The first to third semiconductor patterns SP1, SP2, and SP3, which are sequentially stacked between adjacent ones of the first recesses RS1, may be respectively formed from the active layers ACL. The first to third semiconductor patterns SP1, SP2, and SP3 between adjacent ones of the first recesses RS1 may constitute the first channel pattern CH1.

The first recess RS1 may be formed between adjacent ones of the sacrificial patterns PP. A width of the first recess RS1 in the second direction D2 may decrease as a distance to the substrate 100 decreases.

The sacrificial layers SAL may be exposed through the first recess RS1. A selective etching process may be performed on the exposed sacrificial layers SAL. The etching process may include a wet etching process for selectively removing silicon-germanium. As a result of the etching process, each of the sacrificial layers SAL may be indented to form an indent region IDR. Due to the presence of the indent region IDR, the sacrificial layer SAL may have a concave side surface (e.g., see FIG. 9B). An insulating layer may be formed in the first recess RS1 to fill the indent regions IDR. The first to third semiconductor patterns SP1, SP2, and SP3 and the sacrificial layers SAL, which are exposed by the first recess RS1, may be used as a seed layer for the insulating layer. The insulating layer may be grown as a crystalline dielectric layer, owing to the crystalline structure of the semiconductor materials of the first to third semiconductor patterns SP1, SP2, and SP3 and the sacrificial layers SAL.

The inner spacer ISP may be formed to fill the indent region IDR. In detail, the formation of the inner spacer ISP may include performing a wet etching process on the epitaxial dielectric layer until the side surfaces of the first to third semiconductor patterns SP1, SP2, and SP3 are exposed. Accordingly, the epitaxial dielectric layer may form the inner spacer ISP that is left in the indent region IDR.

Referring back to FIGS. 9A to 9C, the second recesses RS2 in the stacking pattern STP on the second active pattern AP2 may be formed by a method that is similar to that for the first recesses RS1. A selective etching process may be performed on the sacrificial layers SAL, which are exposed by the second recess RS2, to form indent regions IDE on the second active pattern AP2. Due to the indent regions IDE, the second recess RS2 may have a wavy inner side surface. The inner spacers ISP may not be formed in the indent regions IDE on the second active pattern AP2. The first to third semiconductor patterns SP1, SP2, and SP3 between adjacent ones of the second recesses RS2 may constitute the second channel pattern CH2.

Figure 10A:
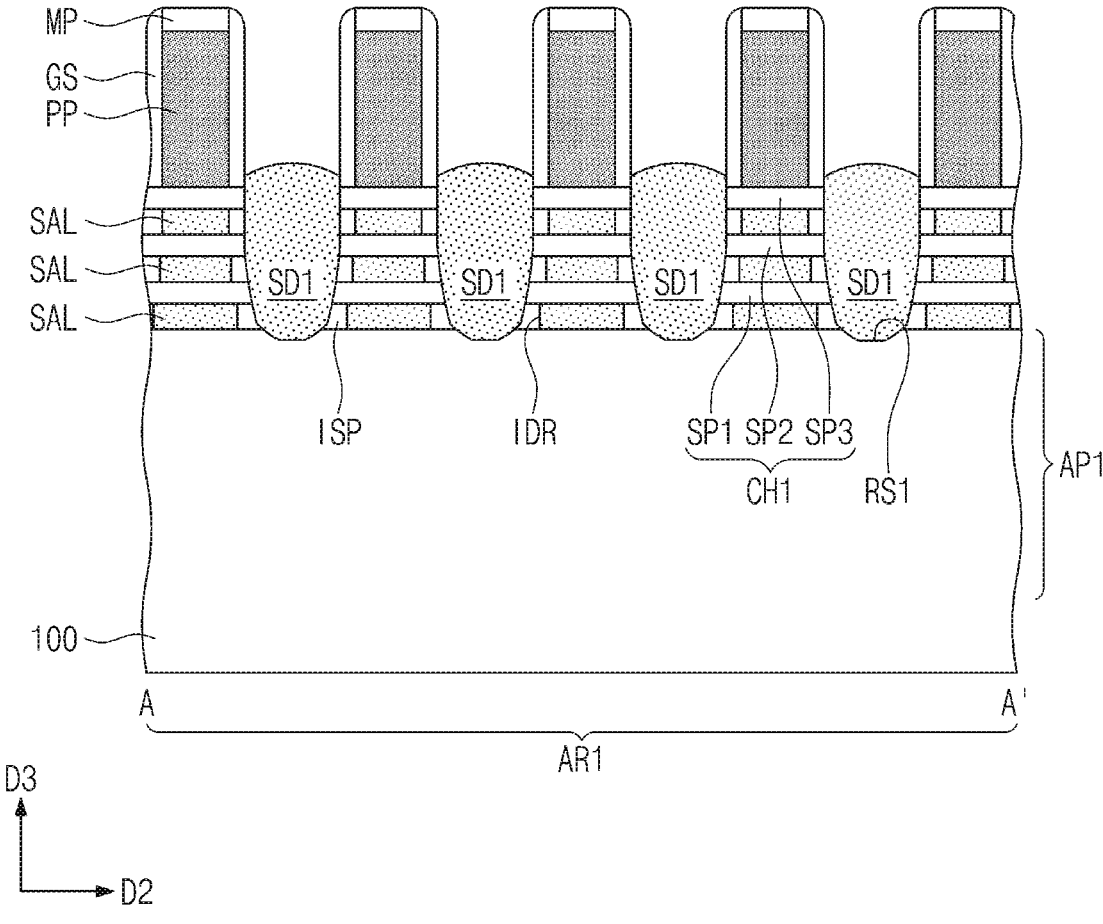
Figure 10B:
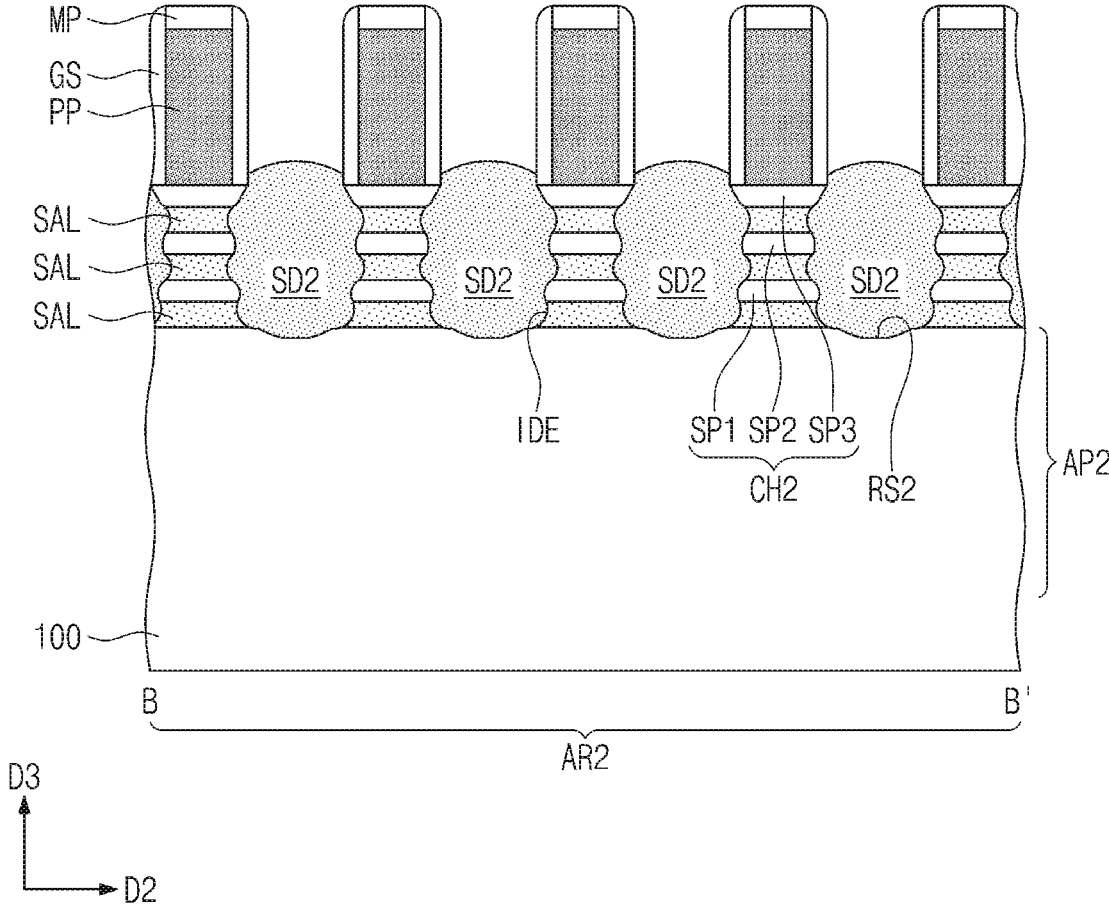
Figure 10C:
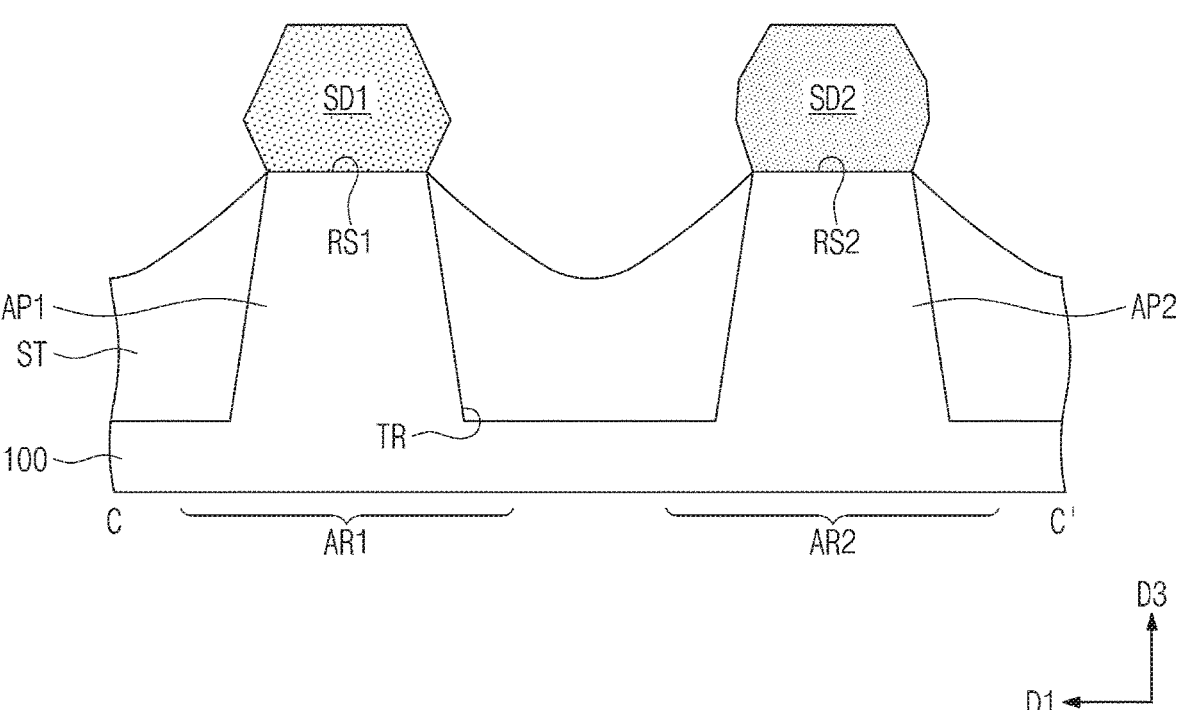

Referring to FIGS. 10A to 10C, the first source/drain patterns SD1 may be formed in the first recesses RS1, respectively. In detail, a SEG process, in which an inner surface of the first recess RS1 is used as a seed layer, may be performed to form an epitaxial layer filling the first recess RS1. The epitaxial layer may be grown using the first to third semiconductor patterns SP1, SP2, and SP3 and the substrate 100, which are exposed by the first recess RS1, as the seed layer. In an embodiment, the SEG process may include a chemical vapor deposition (CVD) process or a molecular beam epitaxy (MBE) process.

In an embodiment, the first source/drain pattern SD1 may be formed of or include the same semiconductor element (e.g., Si) as the substrate 100. During the formation of the first source/drain pattern SD1, the first source/drain pattern SD1 may be doped in-situ with n-type impurities (e.g., phosphorus, arsenic, or antimony). Alternatively, impurities may be injected into the first source/drain pattern SD1, after the formation of the first source/drain pattern SD1.

The second source/drain patterns SD2 may be formed in the second recesses RS2, respectively. In detail, the second source/drain pattern SD2 may be formed by a SEG process using an inner surface of the second recess RS2 as a seed layer.

In an embodiment, the second source/drain pattern SD2 may be formed of or include a semiconductor material (e.g., SiGe) whose lattice constant is greater than that of a semiconductor material of the substrate 100. During the formation of the second source/drain pattern SD2, the second source/drain pattern SD2 may be doped in-situ with p-type impurities (e.g., boron, gallium, or indium). Alternatively, impurities may be injected into the second source/drain pattern SD2, after the formation of the second source/drain pattern SD2.

Figure 11A:
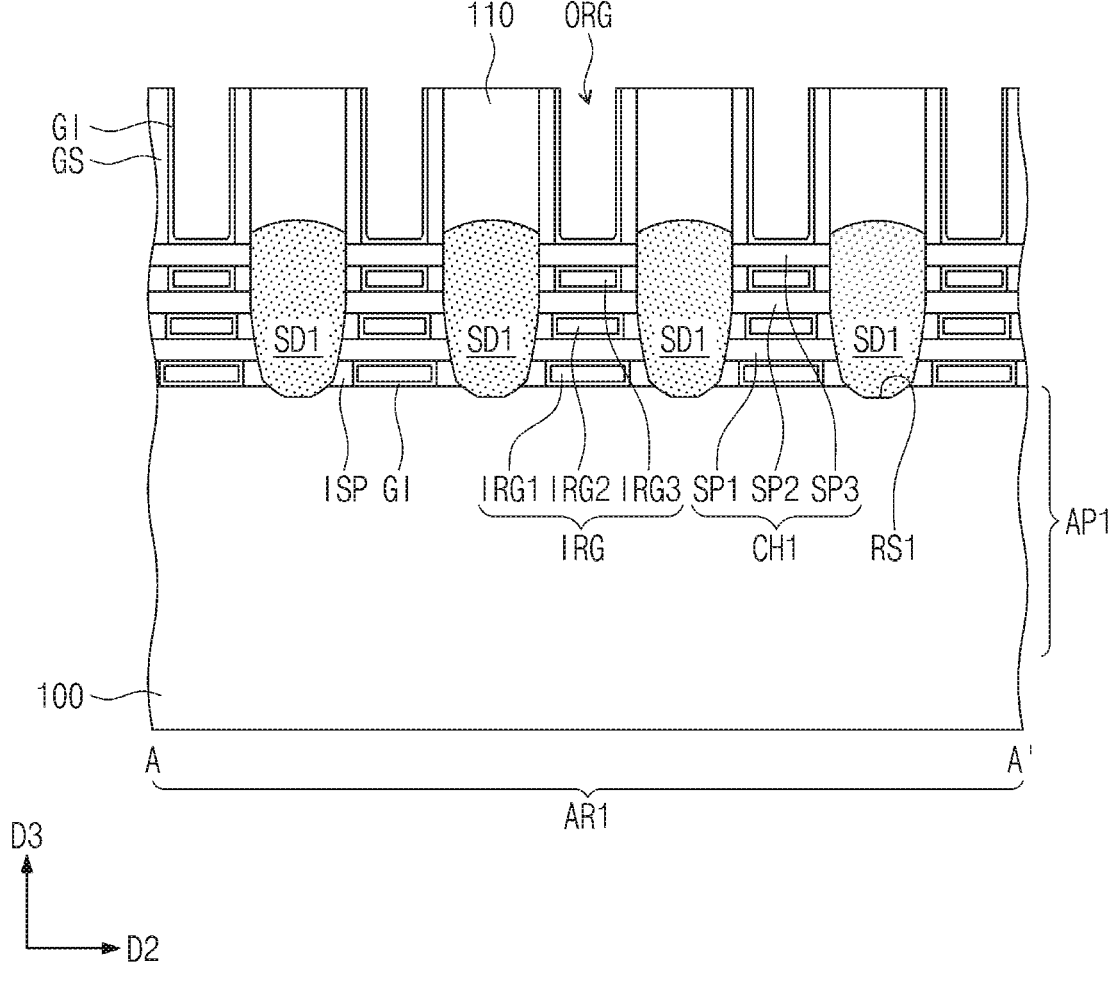
Figure 11B:
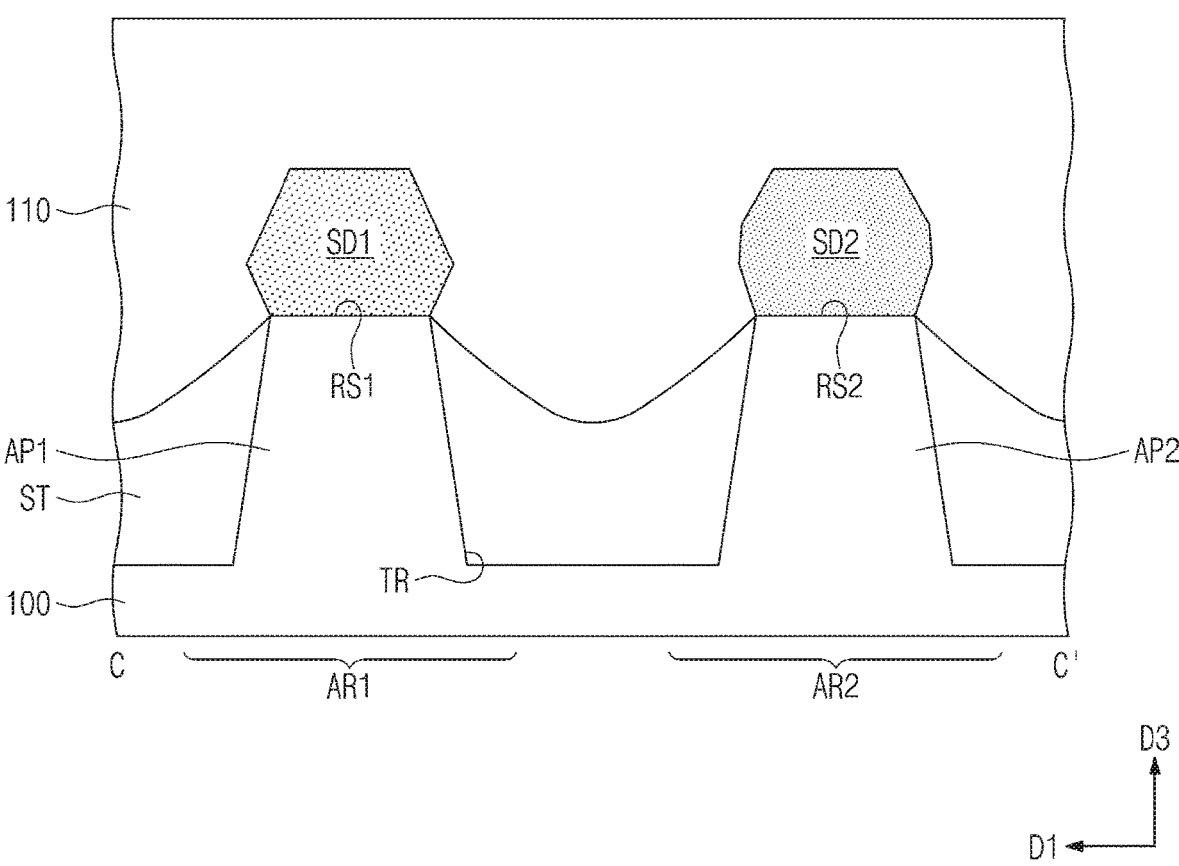
Figure 11C:
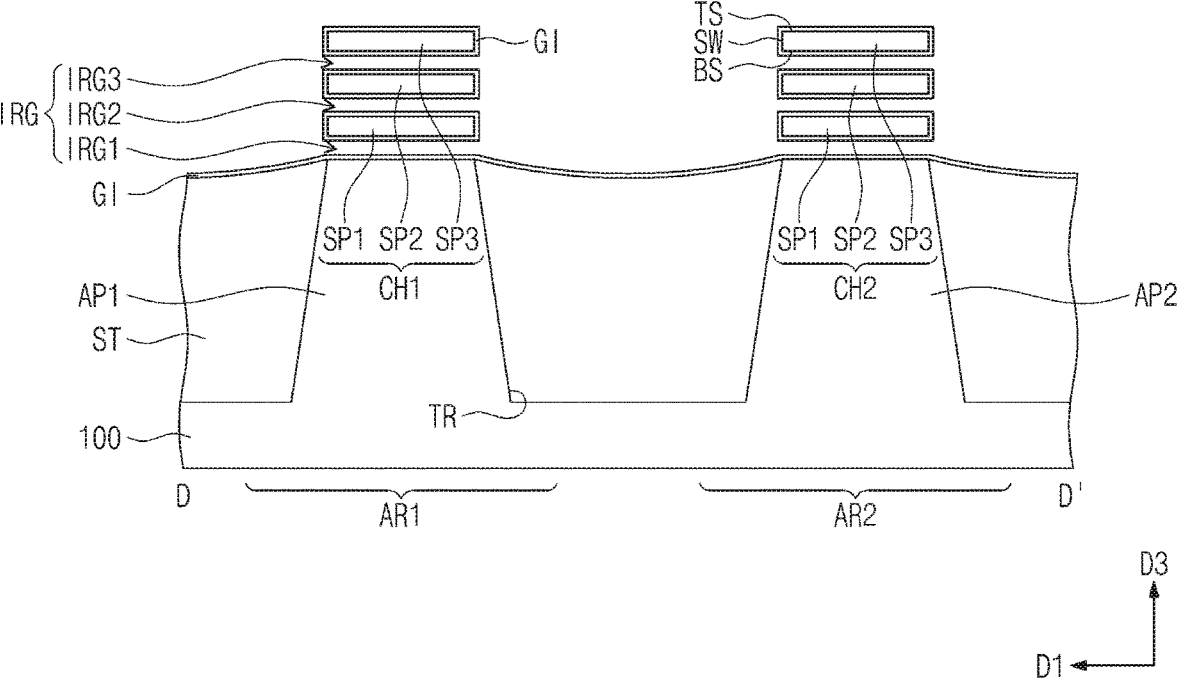

Referring to FIGS. 11A to 11C, the first interlayer insulating layer 110 may be formed to cover the first and second source/drain patterns SD1 and SD2, the hard mask patterns MP, and the gate spacers GS. In an embodiment, the first interlayer insulating layer 110 may include a silicon oxide layer.

The first interlayer insulating layer 110 may be planarized to expose the top surfaces of the sacrificial patterns PP. The planarization of the first interlayer insulating layer 110 may be performed using an etch-back and/or chemical-mechanical polishing (CMP) process. Substantially all of the hard mask patterns MP may be removed during the planarization process. As a result, the first interlayered insulating layer 110 may have a top surface that is substantially coplanar with the top surfaces of the sacrificial patterns PP and the top surfaces of the gate spacers GS.

The exposed sacrificial patterns PP may be selectively removed. As a result of the removal of the sacrificial patterns PP, an outer region ORG exposing the first and second channel patterns CH1 and CH2 may be formed (e.g., see FIG. 11A). The removal of the sacrificial patterns PP may include a wet etching process which is performed using etching solution capable of selectively etching polysilicon.

The sacrificial layers SAL exposed through the outer region ORG may be selectively removed to form inner regions IRG (e.g., see FIGS. 11A and 11C). In detail, a process of selectively etching the sacrificial layers SAL may be performed to leave the first to third semiconductor patterns SP1, SP2, and SP3 and to remove the sacrificial layers SAL. The etching process may be chosen to have a high etch rate for a material (e.g., SiGe) having a relatively high germanium concentration. For example, the etching process may be chosen to have a high etch rate for a silicon germanium layer whose germanium concentration is higher than 10 at %.

During the etching process, the sacrificial layers SAL on the first and second active regions AR1 and AR2 may be removed. The etching process may be a wet etching process. An etchant material, which is used in the etching process, may be chosen to quickly remove the sacrificial layer SAL having a relatively high germanium concentration.

Referring back to FIG. 11C, since the sacrificial layers SAL are selectively removed, the stacked first to third semiconductor patterns SP1, SP2, and SP3 may be left on each of the first and second active patterns AP1 and AP2. As a result of the removal of the sacrificial layers SAL, first to third inner regions IRG1, IRG2, and IRG3 may be formed on each of the first and second active patterns AP1 and AP2.

In detail, the first inner region IRG1 may be formed between the active pattern AP1 or AP2 and the first semiconductor pattern SP1, the second inner region IRG2 may be formed between the first semiconductor pattern SP1 and the second semiconductor pattern SP2, and the third inner region IRG3 may be formed between the second semiconductor pattern SP2 and the third semiconductor pattern SP3.

Referring back to FIGS. 11A to 11C, the gate insulating layer GI may be formed to cover exposed surfaces of the first to third semiconductor patterns SP1, SP2, and SP3. The gate insulating layer GI may be formed to enclose each of the first to third semiconductor patterns SP1, SP2, and SP3. The gate insulating layer GI may be formed in each of the first to third inner regions IRG1, IRG2, and IRG3. The gate insulating layer GI may also be formed in the outer region ORG.

Figure 12A:
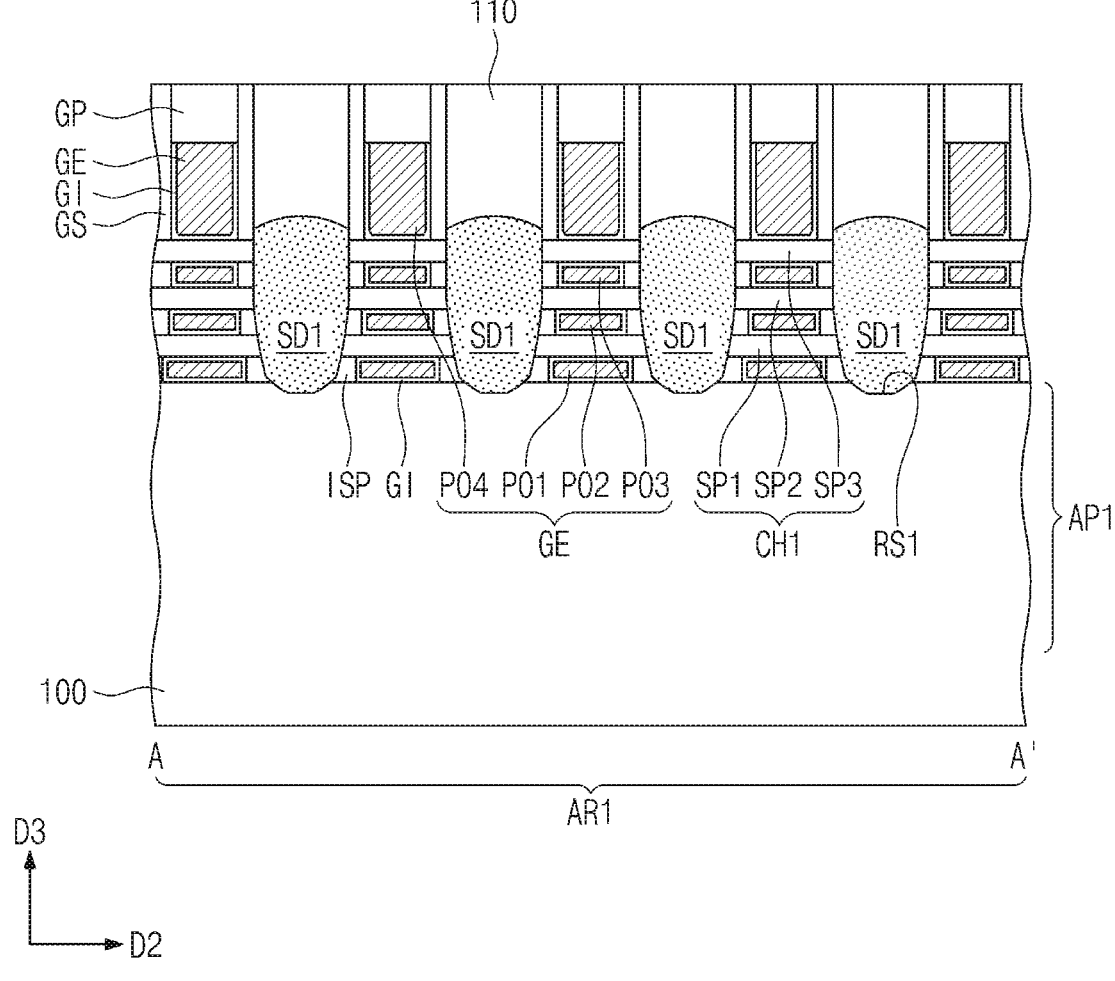
Figure 12B:
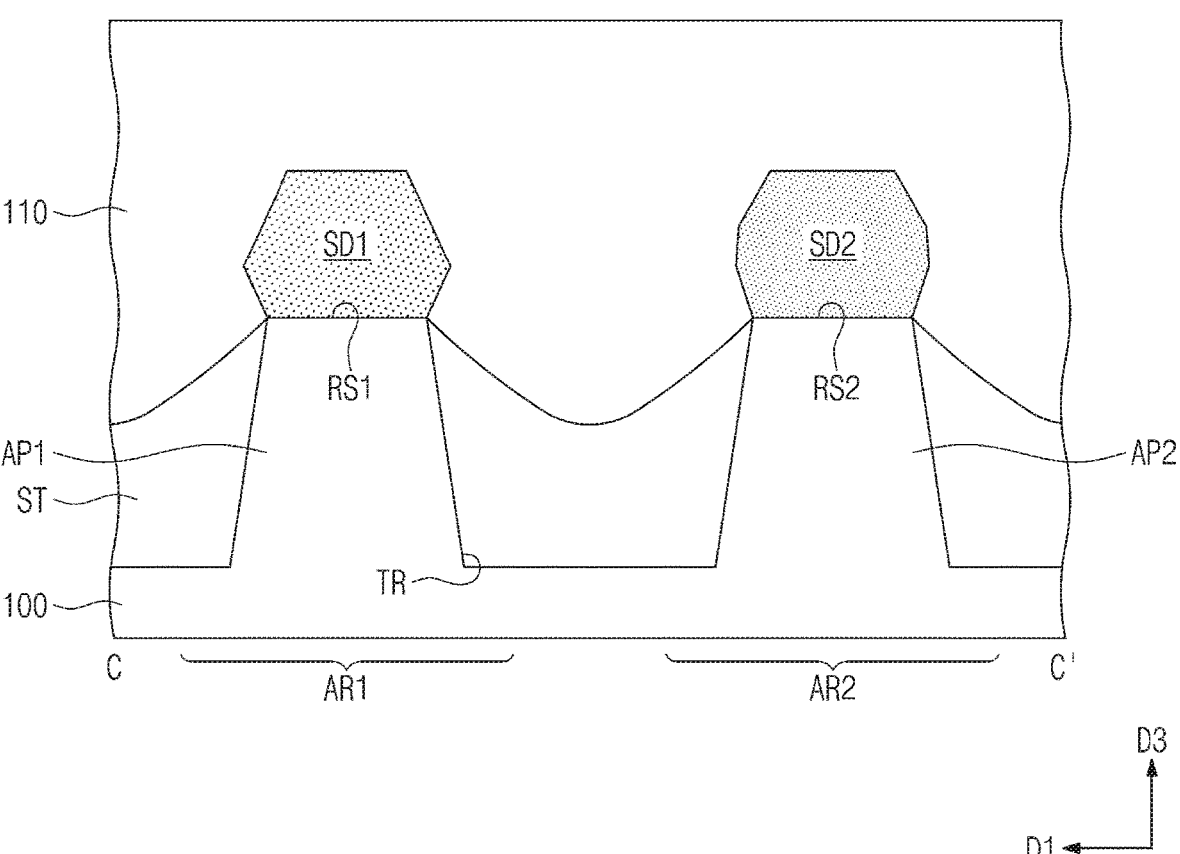
Figure 12C:
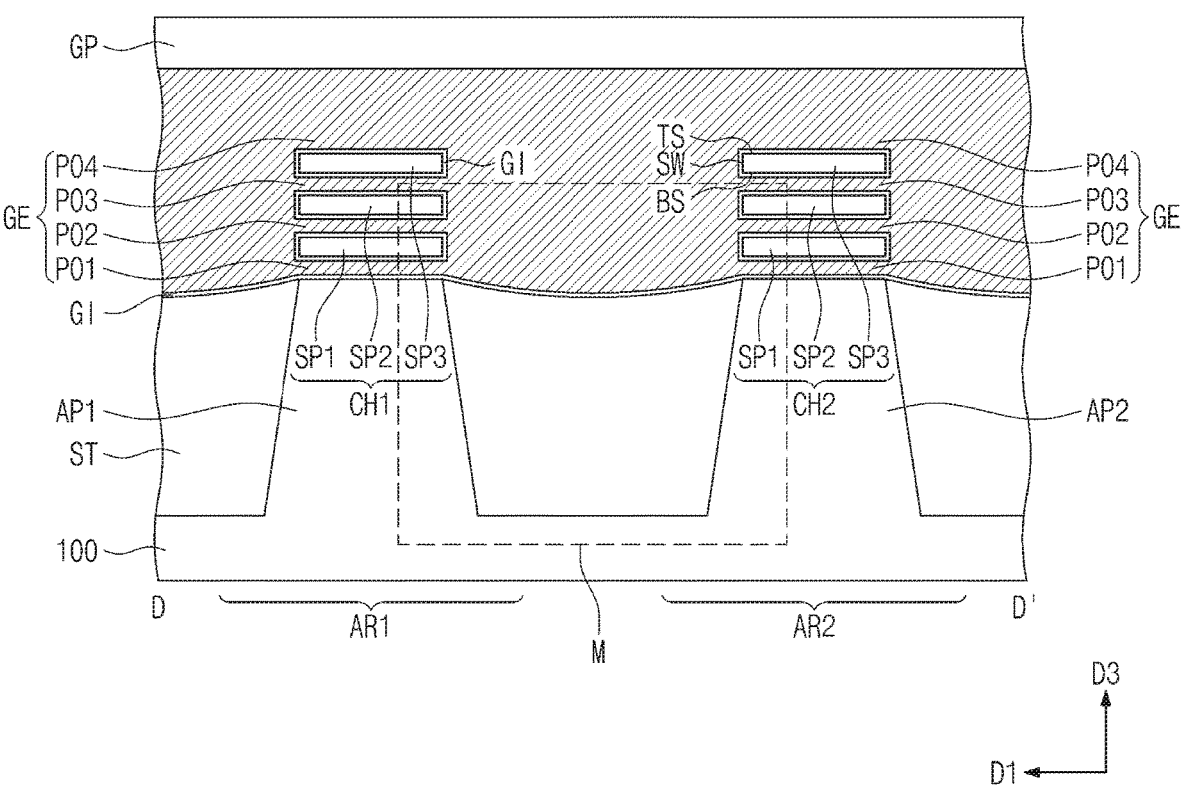

Referring to FIGS. 12A to 12C, the gate electrode GE may be formed on the gate insulating layer GI. The gate electrode GE may include the first to third portions PO1, PO2, and PO3, which are respectively formed in the first to third inner regions IRG1, IRG2, and IRG3, and the fourth portion PO4, which is formed in the outer region ORG. The gate electrode GE may be vertically recessed to have a reduced height. The gate capping pattern GP may be formed on the recessed gate electrode GE.

Referring back to FIGS. 5A to 5D, the second interlayer insulating layer 120 may be formed on the first interlayer insulating layer 110. The second interlayer insulating layer 120 may include a silicon oxide layer. The active contacts AC may be formed through the second interlayer insulating layer 120 and the first interlayer insulating layer 110 and to be electrically connected to the first and second source/drain patterns SD1 and SD2. The gate contact GC may be formed through the second interlayer insulating layer 120 and the gate capping pattern GP and be electrically connected to the gate electrode GE.

The formation of each of the active and gate contacts AC and GC may include forming the barrier pattern BM and forming the conductive pattern FM on the barrier pattern BM. The barrier pattern BM may be conformally formed and may include a metal layer and a metal nitride layer. The conductive pattern FM may be formed of or include a low resistance metal.

The division structures DB may be respectively formed on the first and second borders BD1 and BD2 of the single height cell SHC. The division structure DB may penetrate the second interlayer insulating layer 120 and the gate electrode GE and may be extended into the active pattern AP1 or AP2. The division structure DB may be formed of or include an insulating material (e.g., silicon oxide or silicon nitride).

The third interlayer insulating layer 130 may be formed on the active contacts AC and the gate contacts GC. The first metal layer M1 may be formed in the third interlayer insulating layer 130. The fourth interlayer insulating layer 140 may be formed on the third interlayer insulating layer 130. The second metal layer M2 may be formed in the fourth interlayer insulating layer 140.

In a three-dimensional field effect transistor according to an embodiment of the present inventive concept, a silicon ion implantation (IIP) technology may be used to reinforce a device isolation layer ST. In this case, the device isolation layer ST may have a lowered etch rate in dry and wet etching processes, and thus, the semiconductor device may be fabricated to have improved electrical and reliability characteristics. Furthermore, by using the IIP technology, it may be possible to increase process efficiency in a process of fabricating the semiconductor device.

While example embodiments of the inventive concept have been particularly shown and described, it will be understood by one of ordinary skill in the art that variations in form and detail may be made therein without departing from the spirit and scope of the attached claims,

What is claimed is:

1. A semiconductor device, comprising:
a first active pattern and a second active pattern on a substrate;
a device isolation layer in a trench between the first active pattern and the second active pattern;
a first channel pattern and a second channel pattern provided on the first active pattern and the second active pattern, respectively, each of the first channel pattern and the second channel pattern comprising a plurality of stacked semiconductor patterns; and
a gate electrode on the first channel pattern and the second channel pattern,
wherein the device isolation layer comprises a first portion and a second portion which are vertically overlapped with the gate electrode,
the first portion is provided on the second portion, and
a silicon concentration of the first portion, extending from at least one of the first active pattern or the second active pattern, is higher than a silicon concentration of the second portion.

2. The semiconductor device of claim 1, wherein the silicon concentration of the first portion is in a range of about 41 atomic percent (at %) to about 45 at %.

3. The semiconductor device of claim 2, wherein the silicon concentration of the second portion is in a range of about 31 at % to about 35 at %.

4. The semiconductor device of claim 1, wherein a center region of a top surface of the first portion is flat.

5. The semiconductor device of claim 4, wherein an edge region of the top surface of the first portion covers side surfaces of the first and second active patterns, and the edge region has a curved shape.

6. The semiconductor device of claim 1, wherein the device isolation layer comprises a silicon oxide layer, a silicon oxynitride layer, or combinations thereof.

7. The semiconductor device of claim 1, further comprising a source/drain pattern connected to the semiconductor patterns.

8. The semiconductor device of claim 1, wherein the gate electrode further comprises a portion interposed between adjacent ones of the semiconductor patterns.

9. A semiconductor device, comprising:
a first active pattern and a second active pattern on a substrate;
a device isolation layer in a trench between the first active pattern and the second active pattern;
a first channel pattern and a second channel pattern provided on the first and second active patterns, respectively, each of the first channel pattern and the second channel pattern comprising a plurality of stacked semiconductor patterns; and
a gate electrode on the first channel pattern and the second channel pattern,
wherein the device isolation layer, which is vertically overlapped with the gate electrode, comprises a first portion extending from at least one of the first active pattern or the second active pattern and having a silicon concentration in a range of about 41 at % to about 45 at %, and
a level difference between a top surface of each of the first active pattern and the second active pattern and a top surface of the first portion is larger than 0 Å and is smaller than or equal to about 200 Å.

10. The semiconductor device of claim 9, wherein the device isolation layer further comprises a second portion provided below the first portion, and the silicon concentration of the first portion is higher than a silicon concentration of the second portion.

11. The semiconductor device of claim 10, wherein the silicon concentration of the second portion is in a range of about 31 at % to about 35 at %.

12. The semiconductor device of claim 9, wherein a center region of the top surface of the first portion is flat.

13. The semiconductor device of claim 12, wherein an edge region of the top surface of the first portion covers side surfaces of the first and second active patterns, and the edge region has a curved shape.

14. The semiconductor device of claim 9, wherein the device isolation layer comprises a silicon oxide layer, a silicon oxynitride layer, or combinations thereof.

15. The semiconductor device of claim 9, further comprising a source/drain pattern, which is provided on the active patterns and is connected to the semiconductor patterns.

16. The semiconductor device of claim 9, wherein the gate electrode further comprises a portion interposed between adjacent ones of the semiconductor patterns.

17. A semiconductor device, comprising:

a substrate including an active region having active patterns thereon;

a device isolation layer between an adjacent pair of the active patterns, wherein the device isolation layer comprises a first portion and a second portion, and the first portion is on the second portion, such that the first and second portions overlap each other;

a channel pattern and a source/drain pattern on at least one of the adjacent pair of the active patterns, the channel pattern comprising a plurality of semiconductor patterns, which are vertically stacked and spaced apart from each other;

a gate electrode on the semiconductor patterns, the gate electrode comprising a portion between each adjacent pair of the plurality of semiconductor patterns;

a first gate insulating layer between each of the semiconductor patterns and the portion of the gate electrode;

a second gate insulating layer covering the at least one of the adjacent pair of the active patterns and a top surface of the device isolation layer;

a gate capping pattern on a top surface of the gate electrode;

an interlayer insulating layer on the gate capping pattern;

a gate contact provided through the interlayer insulating layer and the gate capping pattern and electrically connected to the gate electrode;

a first metal layer on the interlayer insulating layer, the first metal layer comprising first interconnection lines, which are electrically connected to the gate contact, and a power line; and a second metal layer on the first metal layer, wherein the second metal layer comprises second interconnection lines electrically connected to the first metal layer, and a silicon concentration of the first portion, extending from the at least one of the adjacent pair of the active patterns, of the device isolation layer is higher than a silicon concentration of the second portion.

18. The semiconductor device of claim 17, wherein the silicon concentration of the first portion is in a range of about 41 at % to about 45 at %.

19. The semiconductor device of claim 18, wherein the silicon concentration of the second portion is in a range of about 31 at % to about 35 at %.

20. The semiconductor device of claim 17, wherein a level difference between a top surface of the at least one of the adjacent pair of the active patterns and a top surface of the first portion is larger than 0 Å and is smaller than or equal to about 200 Å.

* * * * *